(12) United States Patent
Son et al.

(10) Patent No.: US 10,315,400 B2
(45) Date of Patent: Jun. 11, 2019

(54) LAMINATING DEVICE AND LAMINATING METHOD USING THE SAME

(71) Applicant: Samsung Display Co., Ltd., Yongin-si, Gyeonggi-do (KR)

(72) Inventors: Yang-Han Son, Yongin-si (KR); Kyung-Su Lee, Yongin-si (KR); Dai-Hyun Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 209 days.

(21) Appl. No.: 15/344,370

(22) Filed: Nov. 4, 2016

(65) Prior Publication Data

US 2017/0072671 A1    Mar. 16, 2017

Related U.S. Application Data

(62) Division of application No. 14/205,139, filed on Mar. 11, 2014, now Pat. No. 9,498,938.

(30) Foreign Application Priority Data

May 27, 2013    (KR) .................. 10-2013-0059931

(51) Int. Cl.
*G02F 1/13* (2006.01)
*B32B 37/00* (2006.01)
(Continued)

(52) U.S. Cl.
CPC .......... *B32B 37/0046* (2013.01); *B32B 38/18* (2013.01); *B32B 38/1866* (2013.01);
(Continued)

(58) Field of Classification Search
CPC ............ B32B 38/1866; B32B 2457/20; B32B 2457/202; B32B 2457/206;
(Continued)

(56) References Cited

U.S. PATENT DOCUMENTS 4,564,408 A    1/1986   Crumbach et al.
9,446,569 B2   9/2016   Lee et al.
(Continued)

FOREIGN PATENT DOCUMENTS

CN    104097383 A    10/2014
JP    2012-116692 A   6/2012
(Continued)

OTHER PUBLICATIONS

Korean Office Action dated May 23, 2016 for Korean Patent Application No. KR 10-2013-0059931, from which priority is claimed by subject Divisional U.S. Appl. No. 15/344,370.

(Continued)

*Primary Examiner* — Carson Gross
(74) *Attorney, Agent, or Firm* — Lewis Roca Rothgerber Christie LLP

(57) ABSTRACT

A laminating apparatus and method are disclosed. The laminating device includes a first jig, a second jig facing the first jig, an auxiliary film fixing unit and a driving unit. A partially curved cover window is seated on the first jig. An auxiliary film and a panel member are seated on the second jig so as to be flat. The driving unit linearly moves at least one of the first and second jigs.

10 Claims, 12 Drawing Sheets

(51) Int. Cl.
*B32B 37/10* (2006.01)
*B32B 37/12* (2006.01)
*B32B 38/18* (2006.01)
*H01L 51/00* (2006.01)

(52) U.S. Cl.
CPC ........ *H01L 51/0024* (2013.01); *B32B 37/003* (2013.01); *B32B 37/10* (2013.01); *B32B 37/12* (2013.01); *B32B 38/1858* (2013.01); *B32B 2309/68* (2013.01); *B32B 2457/20* (2013.01); *B32B 2457/202* (2013.01); *B32B 2457/206* (2013.01); *B32B 2457/208* (2013.01); *G02F 1/1303* (2013.01); *H01L 2251/5338* (2013.01); *Y10T 156/1028* (2015.01)

(58) Field of Classification Search
CPC .......... B32B 2457/208; B32B 37/0046; B32B 37/003; Y10T 156/1028; H01L 2251/5338; G02F 1/1303
USPC .................................................. 156/228, 475
See application file for complete search history.

(56) References Cited

U.S. PATENT DOCUMENTS

| | | | | |
|---|---|---|---|---|
| 9,796,169 | B2* | 10/2017 | Kim | .................... B32B 37/1292 |
| 2003/0173035 | A1 | 9/2003 | Yamaguchi | |
| 2009/0277578 | A1* | 11/2009 | Sung | .................... B32B 37/003 |
| | | | | 156/285 |
| 2012/0111479 | A1 | 5/2012 | Sung et al. | |
| 2012/0211148 | A1 | 8/2012 | Sung et al. | |
| 2014/0002975 | A1 | 1/2014 | Lee et al. | |
| 2014/0096897 | A1* | 4/2014 | Katou | ................... B29C 51/262 |
| | | | | 156/212 |
| 2014/0299269 | A1 | 10/2014 | Son et al. | |
| 2014/0345791 | A1 | 11/2014 | Son et al. | |
| 2014/0377508 | A1 | 12/2014 | Oh et al. | |

FOREIGN PATENT DOCUMENTS

| | | |
|---|---|---|
| KR | 10-2010-0068620 A | 6/2010 |
| KR | 10-2012-0014414 A | 2/2012 |
| KR | 10-2012-0040783 A | 4/2012 |
| KR | 10-2012-0063611 A | 6/2012 |
| KR | 10-1206328 B1 | 11/2012 |
| KR | 10-1260297 B1 | 4/2013 |
| KR | 10-2014-0002470 A | 1/2014 |
| KR | 10-2014-0002491 A | 1/2014 |
| KR | 10-2014-0010919 A | 1/2014 |
| KR | 10-2014-0044579 A | 4/2014 |
| KR | 10-2014-0052714 A | 5/2014 |
| KR | 10-2014-0120568 A | 10/2014 |
| KR | 10-2015-0048547 A | 5/2015 |
| KR | 10-2015-0077164 A | 7/2015 |
| KR | 10-2015-0108481 A | 9/2015 |

OTHER PUBLICATIONS

U.S. Office Action dated Dec. 2, 2016, issued in U.S. Appl. No. 14/873,707 (11 pages).
U.S. Office Action dated Apr. 19, 2018, issued in U.S. Appl. No. 15/455,852 (8 pages).

* cited by examiner

LAMINATING DEVICE AND LAMINATING METHOD USING THE SAME

CROSS-REFERENCE TO RELATED APPLICATIONS

This application is a divisional of U.S. patent application Ser. No. 14/205,139, filed Mar. 11, 2014, which claims priority under 35 U.S.C. § 119 to Korean Patent Application No. 10-2013-0059931, filed on May 27, 2013, in the Korean Intellectual Property Office, the disclosures of which are incorporated by reference herein in their entireties.

BACKGROUND

Field

The disclosed technology generally relates to a laminating device and method for laminating flexible panels and display devices.

Description of the Related Technology

Mobile electronics are now widely developed and used. Examples of mobile consumer electronic products are tablet computers that have become widely used in recent years in addition to small devices such as mobile phones.

Many mobile product categories include display for providing users visual information such as still images or videos and supporting related functionality. Recently, as other components for driving a display have been miniaturized, the display form factor is of increasingly importance for reducing size and weight. In this regard, flexible displays that are bendable at a predetermined angle are being developed.

In general, flexible displays that are configurable at a set of angles are manufactured using a process, whereby movement of the substrate is not constraint. Since such a device is formed of a flexible material, the device can assume various shapes. Manufacturing by forming a light-emitting unit on a substrate results in a display panel and sealing by encapsulation increases it lifetime. The substrate is formed of a flexible material and the encapsulation unit is formed, for example, as a substrate or a thin film.

SUMMARY OF CERTAIN INVENTIVE ASPECTS

Embodiments of the disclosed technology include a laminating device that laminates a panel member on a cover window and a laminating method.

According to an aspect of the disclosed technology, a laminating device includes a first jig on which a cover window of which at least one portion is curved is seated, a second jig disposed to face the first jig, an auxiliary film fixing unit dispose a panel member on the second jig in a flat state, the auxiliary film fixing unit fixing at least one portion of an auxiliary film on which the panel member is seated; and a driving unit linearly moving at least one of the first and second jigs.

One of an outer surface of the first jig and an outer surface of the second jig may protrude, and the other of the outer surface of the first jig and the outer surface of the second jig is recessed.

An outer surface of the first jig may have at least one curved surface.

A central portion of at least one of an outer surface of the first jig and an outer surface of the second jig may relatively protrude than the other portion of the at least one of the outer surface of the first jig and the outer surface of the second jig.

An outer surface of the second jig contacting the auxiliary film may have at least one curved surface.

The auxiliary film fixing unit may include: a first auxiliary film fixing unit restraining one end of the auxiliary film; and a second auxiliary film fixing unit restraining the other end of the auxiliary film.

The laminating device may further include a cushion unit disposed on at least one of an outer surface of the first jig and an outer surface of the second jig.

The auxiliary film fixing unit is linearly movable on a side of the second jig according to a linear motion of the at least one of the first jig and the second jig.

The laminating device may further include a fixing unit disposed on the first jig to fix the cover window.

The panel member may include at least one of a touch screen panel and a display panel.

According to another aspect of the disclosed technology, a laminating method includes seating a cover window of which at least one portion is curved on a first jig; disposing a panel member seated on an auxiliary film on a second jig facing the first jig in a flat state; and linearly moving at least one of the first and second jigs to press the cover window and the panel member, thereby laminating the cover window and the panel member with each other.

The auxiliary film and the panel member may adhere to each other by using an adhesive.

The cover window may have a size greater than that of the display panel.

A cushion unit is disposed on at least one of an outer surface of the first jig and an outer surface of the second jig.

The laminating of the cover window and the display member may include successively laminating the cover window and the panel member from central portions to both ends thereof.

Both ends of the auxiliary film is fixed to the auxiliary film fixing unit and disposed on the second jig.

The auxiliary film fixing unit is linearly movable on a side of the second jig according to a linear motion of the at least one of the first jig and the second jig.

The seating of the cover window on the first jig may include fixing the cover window through a fixing unit disposed on the first jig.

One of an outer surface of the first jig and an outer surface of the second jig may protrude, and the other of the outer surface of the first jig and the outer surface of the second jig is recessed.

The panel member may include at least one of a touch screen panel and a display panel.

BRIEF DESCRIPTION OF THE DRAWINGS

The above and other features and aspects of the disclosed technology will become more apparent by describing in details of exemplary embodiments thereof with reference to the attached drawings in which.

DETAILED DESCRIPTION OF CERTAIN INVENTIVE EMBODIMENTS

Figure 1:
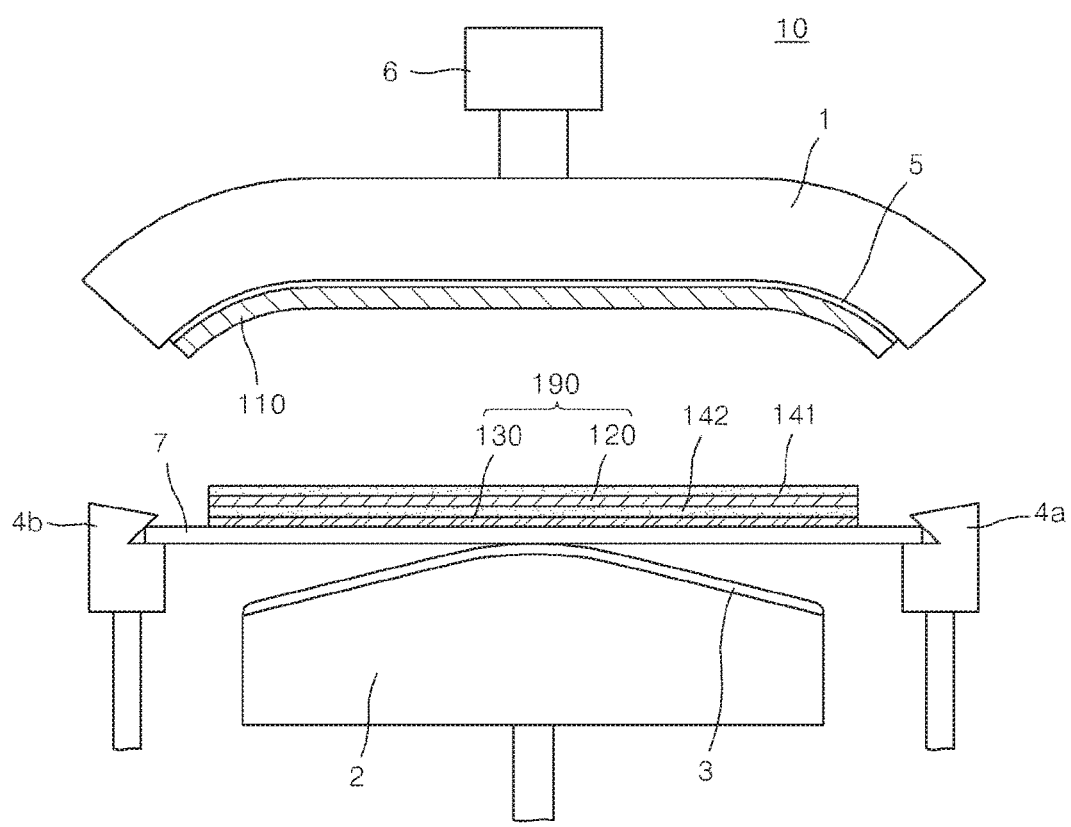
FIG. 1 is a cross-sectional view of a laminating device according to an embodiment of the disclosed technology.

As used herein, the term "and/or" includes any and all combinations of one or more of the associated listed items. Expressions such as "at least one of," when preceding a list of elements, modify the entire list of elements and do not modify the individual elements of the list. Embodiments of the disclosed technology are described in details herein with reference to the accompanying drawings so that this disclosure is easily performed by one of ordinary skill in the art to which the disclosed technology pertains. The disclosed technology may, however, be embodied in different forms and should not be construed as being limited to the embodiments set forth herein. Rather, these embodiments are disclosed so that this disclosure will be thorough and complete, and will fully convey the scope of the disclosed technology to those of ordinary skill in the art. Furthermore, the disclosed technology is only defined by the scope of the claims.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the disclosed technology is not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it is directly on the other element or intervening elements may also be present.

Throughout this specification and the claims that follow, when it is described that an element is "connected" to another element, the element is "directly connected" to the other element or "electrically connected" to the other element through a third element. In addition, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

Here, when a first element is described as being connected to a second element, the first element is not only directly connected to the second element but may also be indirectly connected to the second element via a third element. Further, some of the elements that are not essential to the complete understanding of the disclosed technology are omitted for clarity. Also, like reference numerals refer to like elements throughout.

In the following description, technical terms are used only to explain a specific exemplary embodiment while not limiting the disclosed technology. The terms of a singular form may include plural forms unless referred to the contrary. The terms "include," "comprise," "including," and "comprising," as used herein, specify a component, a process, an operation, and/or an element but do not exclude other components, processes, operations, and/or elements. It will be understood that although the terms "first" and "second" are used herein to describe various elements, these elements should not be limited by these terms. These terms are only used to distinguish one component from other components.

A display device according to embodiments of the disclosed technology may include various devices. In some implementations, the display device includes a liquid display device or an organic light-emitting display device. However, for convenience of descriptions, the organic light-emitting display device as the display device will be described in detail below.

Figure 2:
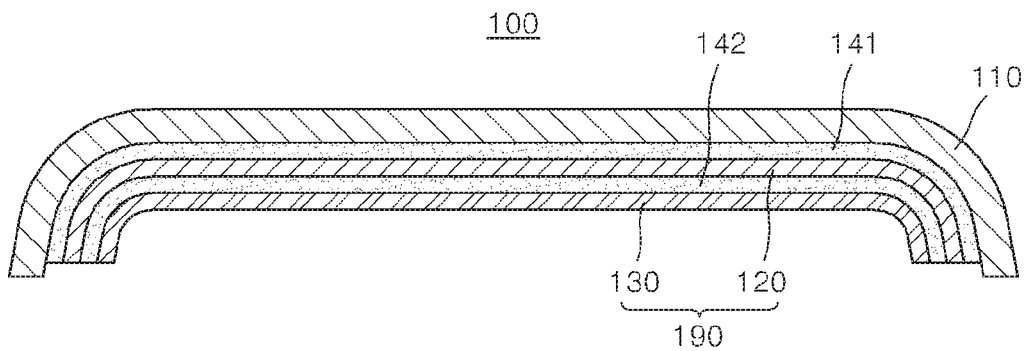
FIG. 2 is a cross-sectional view of a display device manufactured by using the laminating device shown in FIG. 1.
Figure 3:
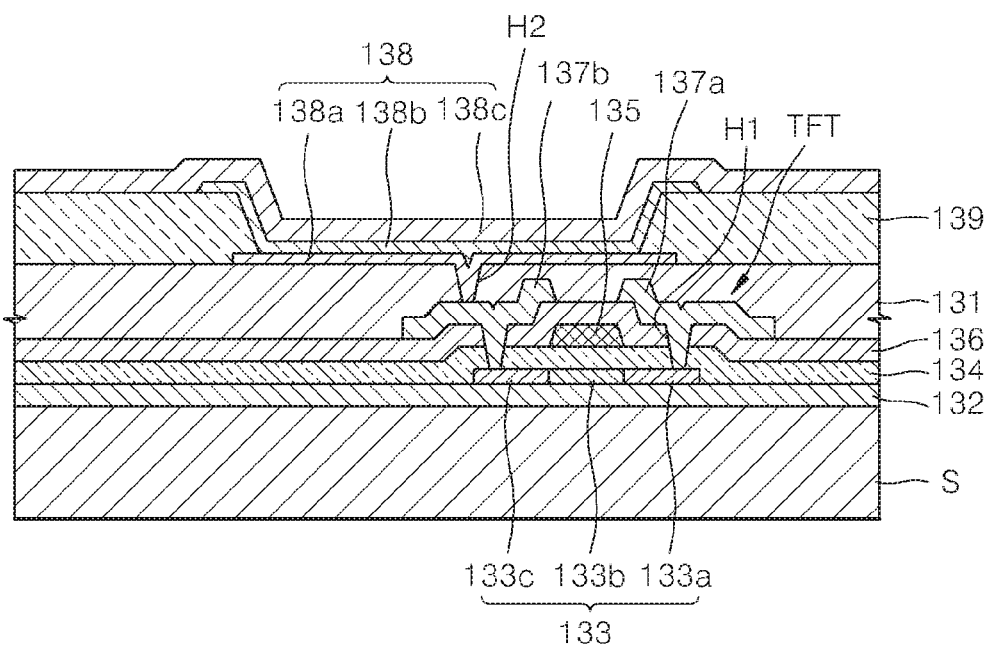
FIG. 3 is a cross-sectional view of a portion of a display panel shown in FIG. 2.

FIG. 1 is a cross-sectional view of a laminating device 10 according to an embodiment of the disclosed technology. FIG. 2 is a cross-sectional view of a display device 100 manufactured by using the laminating device 10 shown in FIG. 1. FIG. 3 is a cross-sectional view of a portion of a display panel shown in FIG. 2.

Referring to FIGS. 1 to 3, the laminating device 10 may have a curved portion. Also, the laminating device 10 may include a first jig 1. The first jig 1 has a seating surface (not shown) on which a cover window 110 is seated. The cover window 110 has at least one curved portion.

The first jig 1 has a shape similar to that of the cover window 110. Particularly, the seating surface of the first jig 1 has a curved surface shape. In an exemplary implementation, one portion of the first jig 1 is flat so that the flat portion of the cover window 110 is seated on the first jig. Also, the other portion of the first jig 1 is curved so that a curved portion of the cover window 110 is seated on it. The seating surface of the first jog is inserted into a side of the first jig 1.

The laminating device 10 includes a second jig 2 separably coupled to the first jig 1. One surface of the second jig 2 is matched in shape with the seating surface of the first jig 1.

In an exemplary implementation, the one surface of the second jig 2 is curved to correspond to the curved portion of the seating surface of the first jig 1. The curved surface of the second jig 2 may protrude toward the first jig 1. Here, an auxiliary film 7 isis seated on a portion of the curved surface of the second jig 2. A panel member (190) is seated on the auxiliary film 7.

Also, an outer surface of the second jig 2 has a central portion relatively protruding. Here, the central portion of the second jig 2 protrudes toward the first jig 1. Thus, when the first and second jigs 1 and 2 are pressed to laminate the cover window 110 to the panel member 190, the cover window 110 and the panel member 190 successively adhere to each other from central portions to both ends thereof. Since bubbles are not generated between the cover window 110 and the panel member 190 when the cover window 110 and the panel member 190 adhere to each other, a defect rate of the display device 100 can be reduced.

At least one of the first and second jigs 1 and 2 is formed of an elastic material such as silicon, rubber, flexible synthetic resin, and the like. Alternatively, at least one of the first and second jigs 1 and 2 is formed of a rigid material such as metal, rigid synthetic resin, and the like. However, for convenience of descriptions, the first and second jigs 1 an 2 which are respectively formed of ridge materials will be described below.

The laminating device 10 may include a driving unit (not marked) connected to at least one of the first and second jigs 1 and 2 to move the at least one of the first and second jigs 1 and 2.

Here, the driving unit may include a first driving unit 6 moving the first jig 1 and a second driving unit (not shown) moving the second jig 2. The first driving unit 6 is manufactured through a method similar to that of the second driving unit. Hereinafter, for convenience of descriptions, the driving unit including the first driving unit 6 will be described in details.

The first driving unit 6 includes various units. In an exemplary implementation, the first driving unit 6 includes a pneumatic or hydraulic cylinder moving the first jig 1. Also, the first driving unit 6 may include a motor operated by using electric energy to move the first jig 1. Hereinafter, for convenience of descriptions, the first driving unit including the cylinder will be described in details.

The laminating device 10 may include a fixing unit 5 preventing the cover window 110 seated on the first jig 1 from being moved or preventing the panel member 190 from being separated from the first jig 1.

Here, the fixing unit 5 may include a suction unit (not shown) in at least one of the first and second jigs 1 and 2. Also, the fixing unit 5 may include a suction pump (not shown) suctioning air within the suction unit.

The fixing unit 5 is not limited to the above-described structure, and thus has various structures. In an exemplary implementation, the fixing unit 5 is included as a separate frame, clamp, or holder that is formed on the first jig 1 to mechanically fix the cover window 110. Also, the fixing unit 5 is an adhesive member and has an adhesion force. Particularly, the fixing unit 5 may include an adhesive chuck (not shown) or electrostatic chuck (not shown) formed on the seating surface of the first jig 1. However, for convenience of descriptions, the fixing unit 5 including the adhesive member will be described in detail below.

The laminating device 10 isis formed to be at a predetermined distance away from the second jig 2. Also, the laminating device 10 may include auxiliary film fixing units 4a and 4b. The auxiliary film fixing units 4a and 4b support the panel member 190. Here, an auxiliary film 7 is fixedly inserted into the auxiliary film fixing units 4a and 4b. Particularly, the plurality of auxiliary film fixing units 4a and 4b are respectively formed on side surfaces of the second jig 2 to face each other, thereby fixing both ends of the auxiliary film 7. The plurality of auxiliary film fixing units 4a and 4b may include a first auxiliary film fixing unit 4a fixing one end of the auxiliary film 7 and a second auxiliary film fixing unit 4b spaced a predetermined distance from the first auxiliary film fixing unit 4a to fix the other end of the auxiliary film 7.

Also, a distance between the first auxiliary film fixing unit 4a and the second auxiliary film fixing unit 4b is greater than a width or length of the panel member 190. Particularly, the distance between the first auxiliary film fixing unit 4a and the second auxiliary film fixing unit 4b is greater than a width or length of the auxiliary film 7. Here, the panel member 190 may include at least one of a display panel 130 and a touch screen panel (TSP) 120. However, for convenience of descriptions, the structure in which the distance between the auxiliary film fixing unit 4a and the second auxiliary film fixing unit 4b is greater than the width of the panel member 190 will be described in detail below.

The laminating device 10 may include a cushion unit 3 formed on at least one of outer surfaces of the first and second jigs 1 and 2. The cushion unit 3 is formed of various materials. Particularly, the cushion unit 3 is formed an elastic material. In an exemplary implementation, the cushion unit 3 is formed of silicon, rubber, sponge, or the like. However, for convenience of descriptions, the cushion unit 3 formed on the outer surface of the second jig 2 will be described in detail below.

As described above, the cushion unit 3 may absorb or disperse a portion of a pressure or force that is applied to at least one of the cover window 110 and the panel member 190 by at least one of the first and second jigs 1 and 2 when the first and second jigs 1 and 2 are pressed with respect to each other. Also, when the first and second jigs 1 and 2 are pressed with respect to each other, the pressure or force applied to the cover window 110 and the panel member 190 is uniformly distributed over an entire region of each of the cover window 110 and the panel member 190.

Thus, the laminating device 10 may quickly easily laminate the cover window 110 of which at least one portion is curved to the panel member 190. In addition, the laminating device 10 may prevent bubbles from being generated between the panel member 190 and the cover window 110 when the cover window 110 and the panel member 190 are laminated, thereby reducing the defect rate of the display device 100.

Hereinafter, the display device 100 manufactured by using the laminating device 10 will be described in detail below.

The display device 100 may include the cover window 110 and the panel member 190. The cover window 110 may have a curved portion. Particularly, the cover window 110 has a flat surface. Here, at least one end of the flat surface is curved. Alternatively, both ends of the flat surface are curved.

In an exemplary implementation, the cover window 110 includes a flat portion having the flat surface and a curved portion. The curved portion extends from the flat portion and is curved. Here, the curved portion is formed on each of both ends of the flat portion.

The panel member 190 includes at least one of the display panel 130 and the TSP 120. In an exemplary implementation, the panel member 190 includes only the display panel 130 and the display panel 130 is attached to the cover window 110. In another exemplary implementation, the panel member 190 includes only the TSP 120 and the TSP 120 is attached to the cover window 110. In another exemplary implementation, the panel member 190 includes the display panel 130 and the TSP 120, and the display panel 130 and the TSP 120 are attached to the cover window 110. Furthermore, the panel member 190 includes adhesive layers 141 and 142. The adhesive layers 141 and 142 are formed between at least two layers of the cover window 110, the TSP 120, and the display panel 130. The adhesive layers 141 and 142 include a first adhesive layer 141 formed between the TSP 120 and the cover window 110. The adhesive layers 141 and 142 also include a second adhesive layer 142 formed between the TSP 120 and the display panel 130.

Each of the first and second adhesive layers 141 and 142 has various shapes. In an exemplary implementation, each of the first and second adhesive layers 141 and 142 includes an optical clear adhesive (OCA) film or an adhesive material.

As described above, the size of the first adhesive layer 141 is similar to that of the TSP 120. Also, the size of the second adhesive layer 142 is similar to that of the display panel 130.

For convenience of descriptions, the panel member 190 including the first adhesive layer 141, the TSP 120, the second adhesive layer 142 and details of the display panel 130 will be described below.

As described above, each of the display panel 130 and the TSP 120 is flexible. Also, the display panel 130 may have a size different from that of the cover window 110. In an exemplary implementation, the size of the display panel 130 is less than that of the cover window 110. In another exemplary implementation, the length of the display panel 130 is less than that of the cover window 110. In another exemplary implementation, a width of the display panel 130 is less than that of the cover window 110. In another exemplary implementation, the length and the width of the display panel 130 are less than those of the cover window 110. However, for convenience of descriptions, the display panel having the length less than that of the cover window 110 that will be described in detail below.

Also, a size of the TSP 120 may be a size less that that of the cover window 110. In an exemplary implementation, a width or a length of the TSP 120 is less than that of the cover window 110. Here, a size of the TSP 120 may be greater than that of the display panel 130. In an exemplary implementation, a width or a length of the TSP 120 is greater than that of the display panel 130. For convenience of descriptions, the TSP 120 having a length less than that of the cover window 110 and greater than that of the display panel will be described in detail below.

The display panel 130 may include a first substrate S and a light-emitting unit (not shown). In an exemplary implementation, the display panel 130 includes an encapsulation unit (not shown) on the light-emitting unit. Here, the encapsulation unit may have a thin film. The encapsulation unit may include a second substrate (not shown) in addition to the thin film. However, for convenience of descriptions, the encapsulation unit having the thin film will be described in detail below.

The light-emitting unit is formed on the first substrate S. Here, the light-emitting unit may include a thin film transistor (TFT). A passivation layer 131 is formed to cover the light-emitting unit and the thin film transistor (TFT). An organic light-emitting device 138 is formed on the passivation layer 131.

The first substrate S is formed of a glass material, but the disclosed technology is not limited thereto. In an exemplary implementation, the first substrate S is formed of a plastic material or a metal material such as stainless steel (SUS) or titanium (Ti). The first substrate S may also be formed of polyimide (PI). Hereinafter, for convenience of descriptions, the first substrate S formed of polyimide will be described in detail below.

A buffer layer 132 is formed of an organic compound and/or inorganic compound is and further formed on a top surface of the first substrate S. Here, the organic compound and/or inorganic compound may include at least one material selected from the group consisting of $SiO_x(x≥1)$, $SiN_x$ $(x≥1)$.

An active layer 133 arranged in a predetermined pattern is formed on the buffer layer 132. Then, the active layer 133 is buried by a gate insulation layer 134. The active layer 133 has a source region 133a and a drain region 133c. Also, the active layer 133 further has a channel region 133b between the source region 133a and the drain region 133c.

In an exemplary implementation, an amorphous silicon layer is formed on the buffer layer 132 and be crystallized to form a polycrystal silicon layer. Then, the polycrystal silicon layer is patterned to form the active layer 133. The source and drain regions 133a and 133c of the active layer 133 are doped with impurities according to a kind of TFTs such as a driving TFT (not shown) and a switching TFT (not shown).

A gate electrode 135 corresponding to the active layer 133 and an interlayer dielectric 136 burying the gate electrode 135 are formed on a top surface of the gate insulation layer 134.

Also, a contact hole is formed in the interlayer dielectric 136 and the gate insulation layer 134. Thus, a source electrode 137a and a drain electrode 137b formed on the interlayer dielectric 136 contacts the source region 133a and the drain region 133c, respectively.

The passivation layer 131 is formed on the thin film transistor (TFT) formed through above-described processes, and then a pixel electrode 138a of an organic light-emitting device (OLED) is formed on the passivation layer 131. The pixel electrode 138a may contact the drain electrode 137b of the thin film transistor (TFT) by a via hole H2 formed in the passivation layer 131. The passivation layer 131 is formed of an organic substance and/or inorganic substance with a single layer or multilayer structure. A top surface of the passivation layer 131 is included as a planarization layer regardless of a curved shape of a lower layer formed under the passive layer 131. On the other hand, the passivation layer 131 is curved according to the curved shape of the lower layer. Also, the passivation layer 131 is formed of a transparent insulation material to achieve a resonance effect.

After the pixel electrode 138a is formed on the passivation layer 131, a pixel define layer 139 is formed by using an organic substance and/or inorganic substance to cover the pixel electrode 138a and the passivation layer 131. Then, the passivation layer 131 is opened to expose the pixel electrode 138a.

Also, an organic emission layer 138b and an opposite electrode 138c are formed on at least the pixel electrode 138a.

The pixel electrode 138a may function as an anode electrode, and the opposite electrode 138c may function as a cathode electrode. Here, the pixel electrode 138a and the opposite electrode 138c may have polarities opposite to each other.

The pixel electrode 138a is formed of a material having a high work function, e.g., a transparent conductor such as ITO, IZO, $In_2O_3$, and ZnO.

The opposite electrode 139c is formed of a material having a low work function, e.g., a metal material such as Ag, Mg, Al, Pt, Pd, Au, Ni, Nd, Ir, Cr, Li, Ca, and compounds thereof. A transflective reflective layer is thinly formed of Mg, Ag, or Al and then is optically resonated so that light is transmitted therethrough.

The pixel electrode 138a and the opposite electrode 138c are insulated from each other by the organic emission layer 138b. Voltages different from each other are applied to the organic emission layer to emit light from the organic emission layer.

A low-molecular or polymer organic layer is used as the organic emission layer 138b. When the low-molecular organic layer is used as the organic emission layer, the organic emission layer may include a hole injection layer (HIL), a hole transport layer (HTL), an organic emission layer (EML) an electron transport layer (ETL), and an electron injection layer (EIL) which are laminated in a single layer or a multi-layered structure. Here, examples of the organic material may include copper phthalocyanine (CuPc), NPB (N,N'-Di(naphthalene-1-yl)-N,N'-diphenyl-benzidine), or tris-8-hydroxyquinoline aluminum (Alq3). The low-molecular organic layer is formed using a vacuum deposition method. Here, the HIL, the HTL, the ETL, and the EIL may serve as common layers, and thus be commonly applied to red, green, and blue pixels. Thus, unlike the embodiment described with reference to FIG. 2, the common layers together with the opposite electrode 138c may cover the whole pixel.

In general, the polymer organic layer may have a structure including the HTL and the EML. Here, the HTL is formed of poly(3,4-ethylenedioxythiophene) (PEDOT), and the EML is formed of a poly-phenylenevinylene (PPV)-based or polyfluorene-based polymer organic material. The HTL and EML is formed using screening printing or inkjet printing.

However, the organic layer is not limited to the above-described structure, and thus various embodiments are applied to the organic layer.

The encapsulation unit may have a thin film encapsulation shape as described above. Particularly, at least one organic layer and at least one inorganic layer are alternately laminated on each other. Particularly, each of the inorganic layer or the organic layer is provided in plurality.

The organic layer is a single or multilayer that is formed of a polymer, e.g., one of polyethylene terephthalate, polyimide, polycarbonateg, epoxy, and polyacrylate. Particularly, the organic layer is formed of polyacrylate. More particularly, the organic layer is formed of a polymerized monomer compound containing a diacrylate-based monomer and a triacrylate-based monomer. Also, a monoacrylate-based monomer is further contained in the monomer compound. Also, photoinitiator such as 2,4,6-trimethylbenzoyl diphenyl phosphoine (TPO) is further contained in the monomer compound, but the disclosed technology is not limited thereto.

The inorganic layer is a single or multilayer containing metal oxide or metal nitride. Particularly, the inorganic layer is formed of one of $SiN_x$, $Al_2O_3$, $SiO_2$, and $TiO_2$.

The uppermost layer of the encapsulation unit, which is exposed to the outside, is an inorganic layer to prevent moisture from being permeated into an organic light-emitting device.

The encapsulation unit may have a sandwich structure in which at least one organic layer is formed between at least two inorganic layers. Alternatively, the encapsulation unit may have a sandwich structure in which at least one inorganic layer is formed between at least two organic layers.

The encapsulation unit may include a first inorganic layer, a first organic layer, and a second inorganic layer which are successively laminated upward from the light-emitting unit. Alternatively, the encapsulation unit may include a first inorganic layer, a first organic layer, a second inorganic layer, a second organic layer, and a third inorganic layer which are successively laminated upward from the light-emitting unit. Alternatively, the encapsulation unit may include a first inorganic layer, a first organic layer, a second inorganic layer, a second organic layer, a third inorganic layer, a third organic layer, and a fourth inorganic layer which are successively laminated upward from the light-emitting unit.

A halogenated metal layer containing LiF is additionally formed between the light-emitting unit and the first inorganic layer. The halogenated metal layer may prevent the light-emitting unit from being damaged when the first inorganic layer is formed by using a sputtering method or a plasma deposition method.

The first organic layer may have an area less than that of the second inorganic layer, and the second organic layer may also have an area less than the of the third inorganic layer. Also, the first organic layer is fully covered by the second inorganic layer, and the second organic layer may also be fully covered by the third inorganic layer.

The encapsulation unit may include the second substrate as described above. Here, the second substrate is formed of a material similar to that of the first substrate S. Particularly, the second substrate is formed of a glass material similar to that of the first substrate S, but the disclosed technology is not limited thereto. In an exemplary implementation, the second substrate is formed of a plastic material.

In an exemplary implementation, the TSP 120 has a panel shape and is formed on the display panel 130. In another exemplary implementation, the TSP 120 has a pattern shape and is formed on the display panel 130. In another exemplary implementation, the TSP 120 is formed on the encapsulation unit. The TSP 120 may also be formed on the cover window 110 in the above-described panel or pattern shape.

Here, the formation of the TSP 120 is equal to a general technology, and thus detailed descriptions thereof will be omitted. Hereinafter, for convenience of descriptions, the structure in which the TSP 120 is formed on the display panel 130 in the panel shape will be described in details.

Hereinafter, a method of manufacturing the display device 100 will be described in details.

The method of manufacturing the display device 100 by using the laminating device 10 will be described in detail below.

A cover window 110 is processed to manufacture the display device 100. Here, the cover window 110 is formed of various materials. In an exemplary implementation, the cover window 110 is formed of a glass or plastic material. However, the cover window 110 may not be limited to the above-described material. In an exemplary implementation, the cover window 110 is formed of various materials and a portion of the cover window 110 is capable of being curved.

When the cover window 110 is processed as described above, both ends of the cover window 110 are bent and thus curved. Here, both curved ends of the cover window 110 are curved from a flat portion of the cover window 110. Particularly, each of both curved ends of the cover window 110 extends from the flat portion of the cover window 110 and has an arc shape with a predetermined radius. Here, each of both curved ends of the cover window 110 has an oval shape, but do not have the arc shape.

While or after the cover window 110 is manufactured as described above, a display panel 130 and a TSP 120 are manufactured. Here, since the method of manufacturing the display panel 130 and TSP 120 is equal to a general method of manufacturing a general display panel 130 and TSP 120, their detailed descriptions will be omitted.

When the display panel 130 and the TSP 120 are prepared, a second adhesive layer 142 is seated on a side of the display panel 130. In an exemplary implementation, a second adhesive layer 142 is seated on an encapsulation unit.

Here, the second adhesive layer 142 has a film shape and is attached to the encapsulation unit. Also, the second adhesive layer 142 is included as a material so that the second adhesive layer 142 is applied on the encapsulation unit. However, for convenience of descriptions, the second adhesive layer 142 having the film shape will be described in detail below.

When the above-described process is finished, the display panel 130 and the TSP 120 are attached to each other. Since the method of attaching the display panel 130 to the TSP 120 is equal to a general method, detailed descriptions thereof will be omitted.

When the display panel 130 and the TSP 120 are attached to each other, a first adhesive layer 141 is applied on the TSP 120. Because the method of applying the first adhesive layer 141 is equal to the method of applying the second adhesive layer 142, detailed description thereof will be omitted.

While or after the above-described process is performed, the panel member 190 is seated on an auxiliary film 7. Here, an adhesive iscan be applied on the auxiliary film 7 to fix the panel member 190.

When the above-described process is finished, the auxiliary film 7 is fixed through a first auxiliary film fixing unit 4a and a second auxiliary film fixing unit 4b. Here, a distance between the first auxiliary film fixing unit 4a and the second auxiliary film fixing unit 4b is greater than a width of the auxiliary film 7 as described above. Thus, when the auxiliary film 7 is fixed to the first and second auxiliary film fixing units 4a and 4b, the first and second auxiliary film fixing units 4a and 4b will pull both ends of the auxiliary film 7 to prevent the auxiliary film 7 from drooping down by a weight thereof.

While the above-described process is performed, the cover window 110 is seated on a first jig 1. Here, the first jig 1 and a second jig 2 are formed to face each other. In an exemplary implementation, the first jig 1 is formed above the second jig 2. In another exemplary implementation, the first jig 1 is formed under the second jig 2. However, for convenience of descriptions, the structure in which the first jig 1 is formed above the second jig 2 will be described in detail below. Here, the positions of the first and second jigs 1 and 2 are merely an embodiment of the disclosed technology and thus, the disclosed technology is not limited thereto.

As described above, when the cover window 110 is seated on the first jig 1, the cover window 110 is fixed by a fixing unit 5. Here, the fixing unit 5 is included as an adhesive member to support the cover window 110.

In this case, at least one of the first and second jigs 1 and 2 operates linearly. In an exemplary implementation, the first jig 1 moves toward the second jig 2. In another exemplary implementation, the second jig 2 moves toward the first jig 1. Also, the first and second jigs 1 and 2 may operate to approach each other. Hereinafter, for convenience of descriptions, the structure in which the first jig 1 operates will be described in detail below.

As described above, the first jig 1 may have a curved surface so that one surface of the cover window 110 is closely attached to the curved surface of the first jig 1. Particularly, the one surface of the first jig 1 may have a curved shape that is recessed in one direction.

As described above, when the cover window 110 and the panel member 190 are prepared, a first driving unit 6 is driven to move the first jig 1 toward the second jig 2. In an exemplary implementation, the first driving unit 6 is programmed to operate for a predetermined time.

As described above, when the first driving unit 6 operates, the first jig 1 approaches the second jig 2. Continuously, when the first jig 1 moves toward the second jig 2, the first adhesive layer 141 contacts the cover window 110.

When the first driving unit 6 continuously operates, the first adhesive layer 141 contacts the cover window 110 and thus is pressed. In an exemplary implementation, a central portion of the second jig 2 protrudes toward the first jig 1 when compared to other portions thereof. Thus, the first adhesive layer 141 contacts the cover window 110 outward from a central portion thereof.

The central portions of the cover window 110 and the first adhesive layer 141 are attached to each other according to the progress of the first jig 1. In an exemplary implementation, the cover window 110 and the first adhesive layer 141 are successively attached to each other from the central portions to both ends thereof.

While the above-described process is performed, the first and second auxiliary film fixing units 4a and 4b linearly move together with the first jig 1. Here, the first and second auxiliary film fixing units 4a and 4b may linearly move in the same direction as that of the first jig 1. However, the first and second auxiliary film fixing units 4a and 4b can be fixed without being limited to the above-described structure.

As described above, when the first jig 1 linearly moves, the first and second jigs 1 and 2 press the cover window 110 and the panel member 190. Here, as described above, a cushion unit 3 may uniformly disperse a pressure or force applied to the cover window 110 and the panel member 190.

When the above-described process is finished, the display device 100 is manufactured. Here, the first driving unit 6 may operate to space the first jig 1 from the second jig 2. In an exemplary implementation, the display device 100 is in a state of being attached to the auxiliary film 7. Furthermore, the display device 100 together with the cover window 110 is attached to the first jig 1. Here, a user may separate the auxiliary film 7 from the first and second auxiliary film fixing units 4a and 4b and then separate the display device 100 from the auxiliary film 7. Also, the user may separate the display device 100 attached to the first jig 1 to withdraw the display device 100.

The above-described process is performed in a vacuum state. Here, a laminating device 10 may include a chamber (not shown) and a pressure adjustment unit (not shown) formed within the chamber to adjust an inner pressure of the chamber. In an exemplary implementation, the pressure adjustment unit includes a suction tube (not shown) connected to the chamber and a vacuum pump (not shown) formed on the suction tube.

Thus, the laminating device 10 can quickly accurately manufacture the display device 100 having the curved shape. In an exemplary implementation, the laminating device 10 can accurately laminate the window cover 110 having the curved shape to the panel member 190 and minimize a defect rate and improve product quality.

In addition, the laminating device 10 can effectively discharge bubbles generated between the cover window 110 and the panel member 190 when the laminating process is performed to allow the cover window 100 to firmly adhere to the panel member 190.

Figure 4:
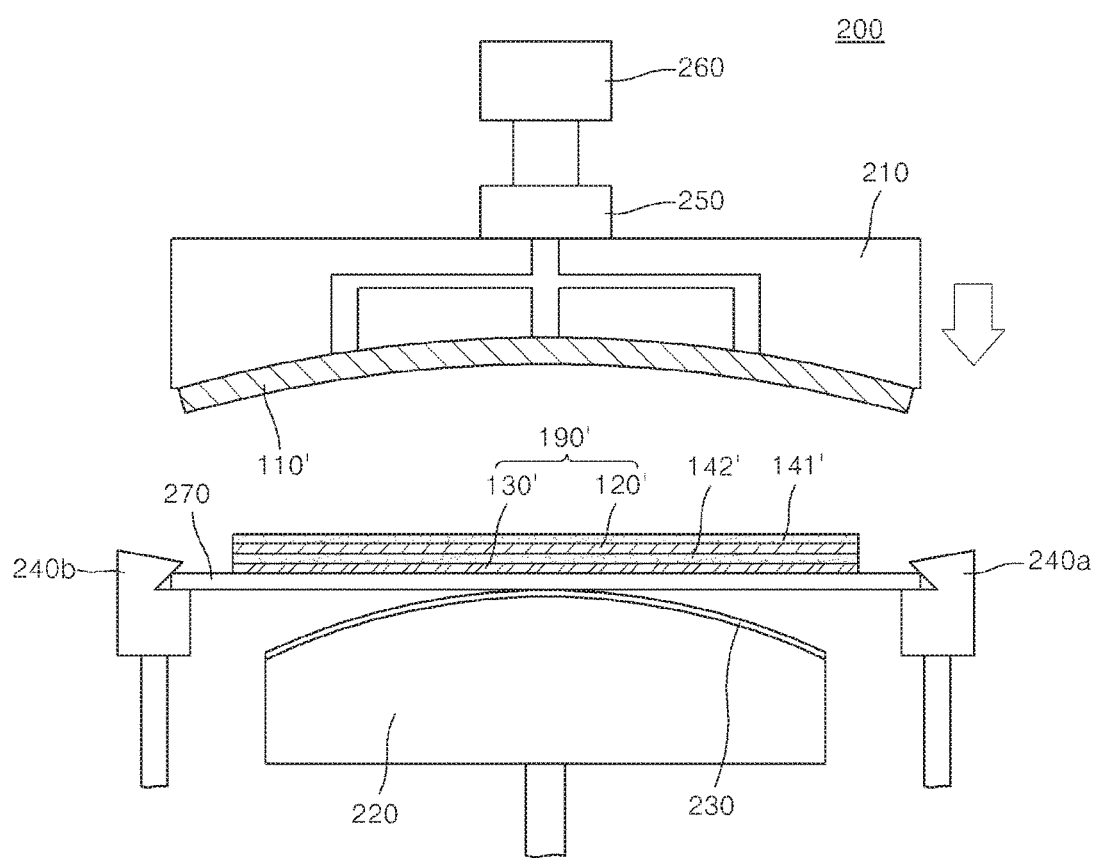
FIG. 4 is a cross-sectional view of a laminating device according to another embodiment of the disclosed technology.
Figure 5:
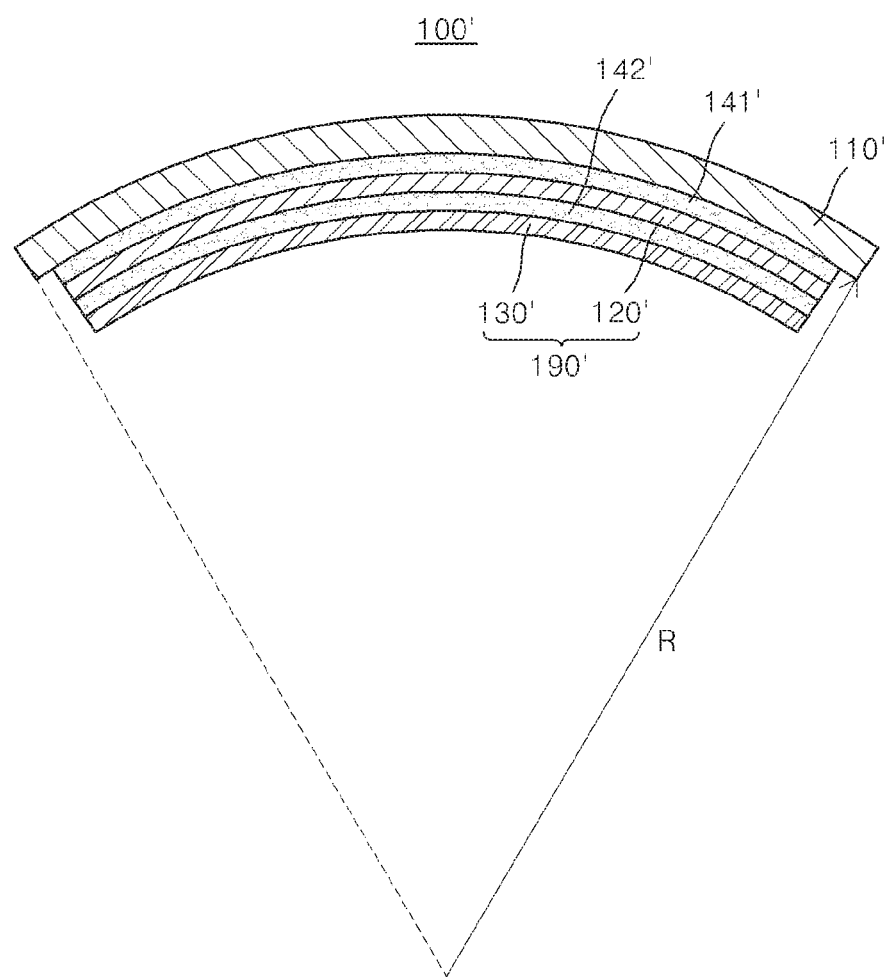
FIG. 5 is a cross-sectional view of a display device manufactured by using the laminating device shown in FIG. 4.

FIG. 4 is a cross-sectional view of a laminating device 200 according to another embodiment of the disclosed technology. FIG. 5 is a cross-sectional view of a display device 100' manufactured by using the laminating device 200 shown in FIG. 4.

Referring to FIGS. 4 and 5, the display device 100' may include a cover window 110', a first adhesive layer 141', a panel member (190'), and a second adhesive layer 142'. Also, the panel member 190' may include at least one of a touch screen panel (TSP) 120' and a display panel 130'. Hereinafter, for convenience of descriptions, the panel member 190' including all of the TSP 120' and the display panel 130' will be described in details.

The cover window 110', the first adhesive layer 141', the TSP 120', the second adhesive layer 142' and the display panel 130' are similar to the cover window 110, the first adhesive layer 141, the TSP 120, the second adhesive layer 142, and the display panel 130 which are described with reference to FIGS. 1 to 3, respectively.

Here, the cover window 110' may have at least one curved portion. In an exemplary implementation, the cover window 110' has a curved surface with a predetermined curvature radius. Specifically, the cover window 110' has a curved surface with a curvature radius R in a length or width direction thereof. Hereinafter, for convenience of descriptions, the cover window 110' having the curved surface with the curvature radius R in the length direction thereof will be described in detail below.

The laminating device 200 includes a first jig 210, a second jig 220, a cushion unit 230, auxiliary film fixing units 240a and 240b, a fixing unit 250 and a driving unit 260. Here, the first jig 210, the second jig 220, the cushion unit 230, the auxiliary film fixing units 240a and 240b, the fixing unit 250, and the driving unit 260 are similar to those according to the foregoing embodiment.

At least one portion of an outer surface of the first jig 210 has the same shape as an outer surface of the cover window 110'. In an exemplary implementation, at least one portion of an outer surface of the first jig 210 has a curved surface with a predetermined curvature radius similar to that of an outer surface of the cover window 110'. Here, the curved surface formed on the outer surface of the first jig 210 is recessed toward an upper side when viewed in FIG. 4.

An outer surface of the second jig 220 is matched in shape with the outer surface of the first jig 210. In an exemplary implementation, the outer surface of the second jig 220 protrudes to match the recessed outer surface of the first jig 210. Here, the outer surface of the second jig 220 may have a predetermined curvature radius.

The fixing unit 250 has various structures as described above. In an exemplary implementation, the fixing unit 250 includes an adhesive chuck or an electrostatic chuck. In another exemplary implementation, the fixing unit 250 is included as an adhesive material. The fixing unit 250 may also include a suction unit (not marked) formed within the first jig 210 and a suction pump (not marked) suctioning air within the suction unit. A portion of the suction unit is exposed to the outside of the first jig 210. In another exemplary implementation, the fixing unit 250 includes a separate frame, clamp, or holder that mechanically fixes the cover window 110'. Hereinafter, for convenience of descriptions, the fixing unit 250 including the suction unit and the suction pump will be described in detail below.

The auxiliary film fixing units 240a and 240b and the driving unit 260 except for the first jig 210, the second jig 220, and the fixing unit 250 are equal or similar to those according to the foregoing embodiment, and thus, their detailed descriptions will be omitted. Hereinafter, an operation of the laminating device 200 will be described in details.

When the display device 100' is manufactured by using the laminating device 200, processes similar to those according to the foregoing embodiment is performed. Particularly, as described above, the cover window 110', the TSP 120', and the display panel 130' are manufactured and prepared.

When the above-described process is finished, the cover window 110' is seated on the first jig 210. Because one surface of the cover window 110' has the same shape as the seating surface of the first jig 210, the one surface of the cover window 110' is closely attached to the seating surface of the first jig 210.

As described above, when the cover window 110' is seated on the first jig 210, the suction pump operates to suction air within the suction unit. Here, the suction unit exposed to the outer surface of the first jig 210 may absorb and fix the outer surface of the cover window 110'.

The TSP 120' and the display panel 130' may adhere to each other by using the second adhesive layer 142', and then the first adhesive layer 141' is formed on the TSP 120' to fix the display panel 130' to an auxiliary film 270. Here, since the method of fixing the display panel 130' to the auxiliary film 270 is equal or similar to that according to the foregoing embodiment, detailed descriptions thereof will be omitted.

As described above, the TSP 120' and the display panel 130' are fixed to the auxiliary film 270 and the auxiliary film 270 is fixed to the first and second auxiliary film fixing units 240a and 240b. Here, the first and second auxiliary film fixing units 240a and 244b pull both ends of the auxiliary film 270 to maintain a tension of the auxiliary film 270 at a predetermined level or more. Thus, movement of the auxiliary film 270, the TSP 120', and the display panel 130' toward the second jig 220 by weights of the TSP 120' and the display panel 130' or an external force can be prevented by the tension of the auxiliary film 270.

When the above-described process is finished, the driving unit 260 operates to move at least one of the first and second jigs 210 and 220. Also, the first and second auxiliary film fixing units 240a and 240b linearly move according to the operation of the driving unit 260. However, for convenience of descriptions, the structure in which the driving unit 260 moves the first jig 210 to the second jig 220 will be described in detail below. And the structure in which the first and second auxiliary film fixing units 240a and 244b are fixed to fix the auxiliary film 270 will be described in detail below.

As described above, when the driving unit 260 operates, the first jig 210 moves to the second jig 220 and then at least one portion of the cover window 110' absorbed to the first jig 210 contact the first adhesive layer 141'.

Here, since a central portion of the second jig 220 protrudes to have a curved shape, the first adhesive layer 141' and the cover window 110' are successively attached from a central portion to both ends of the cover window 110'.

Also, while the above-described process is performed, the cushion unit 230 disperses a force applied to the cover window 110', the TSP 120' and the display panel 130'. In an exemplary implementation, the cushion unit 230 removes bubbles generated between the first adhesive layer 141' and the outer surface of the cover window 110' in addition to the dispersion of the force as described above.

Thus, the laminating device 200 successively attaches the cover window 110' and the panel member 190' to each other to maximally prevent the generation of the bubbles. Also, the laminating device 200 may manufacture the display device 100' in various shapes.

Particularly, when the display device 100' is manufactured by using the laminating device 200, the panel member 190' is fixed by using the auxiliary film 270 without directly applying a force to the panel member 190' to minimize damage of the panel member 190'. This occurs when the panel member 190' is fixed by using a separate fixing unit.

Figure 6:
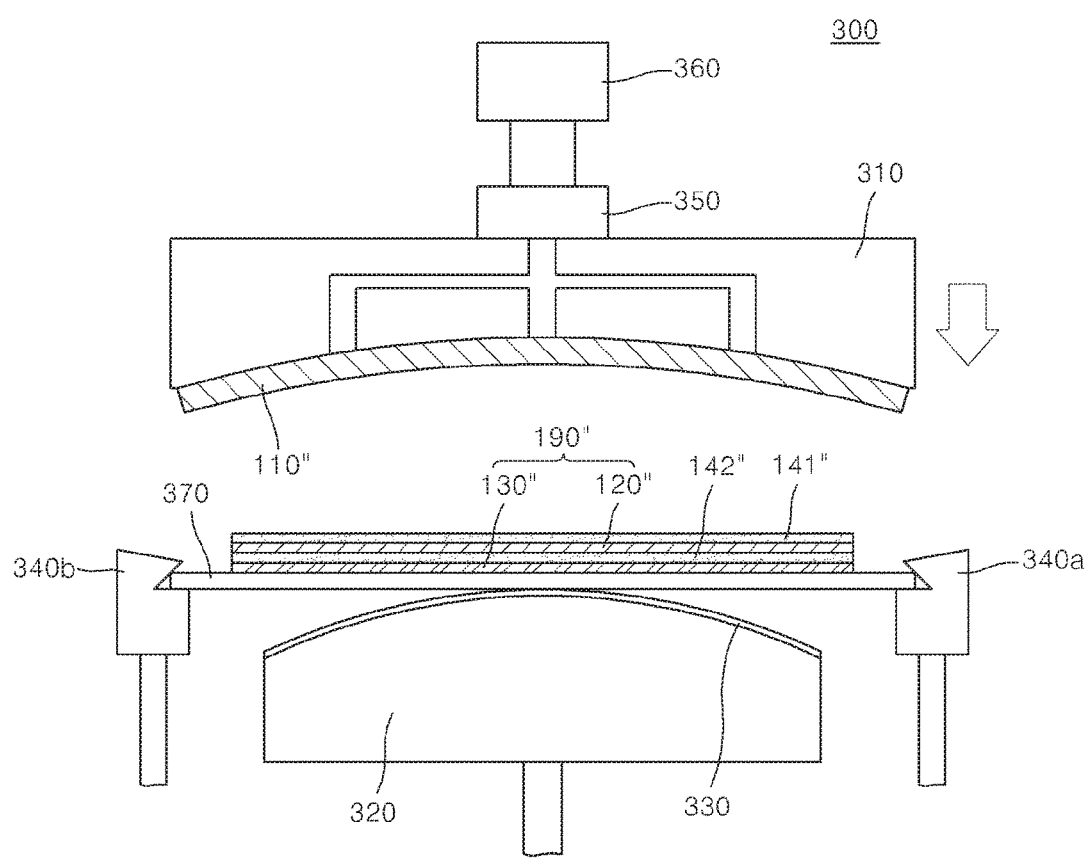
FIG. 6 is a cross-sectional view of a laminating device according to further another embodiment of the disclosed technology.
Figure 7:
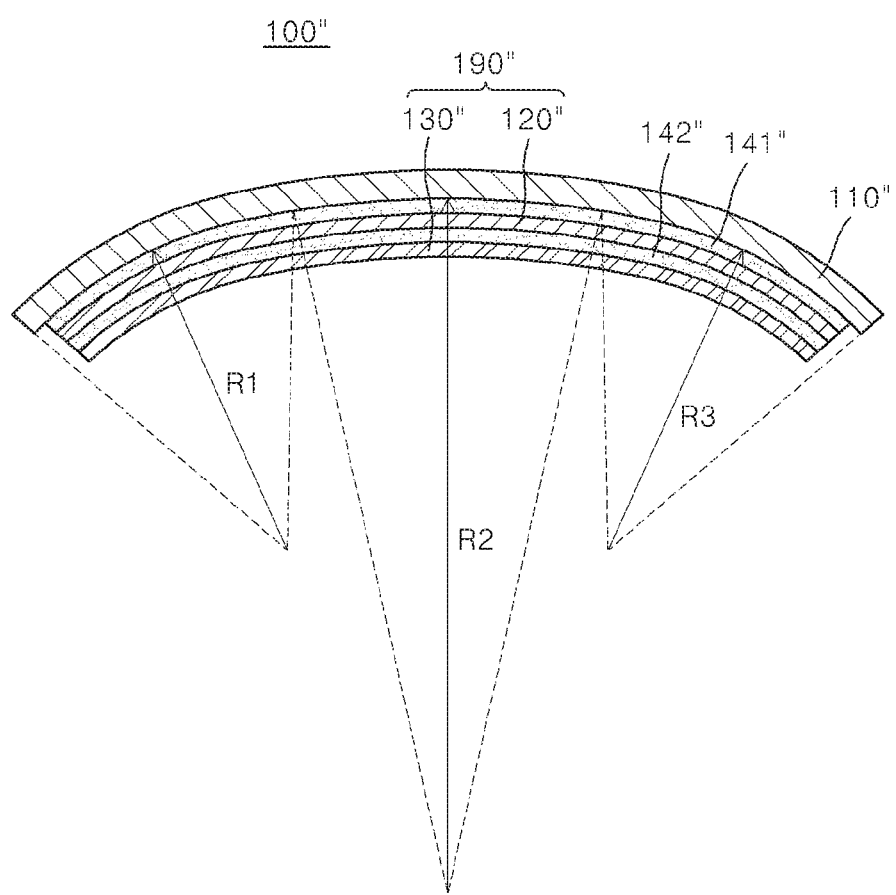
FIG. 7 is a cross-sectional view of a display device manufactured by using the laminating device shown in FIG. 4.

FIG. 6 is a cross-sectional view of a laminating device 300 according to further another embodiment of the disclosed technology. FIG. 7 is a cross-sectional view of a display device 100" manufactured by using the laminating device 300 shown in FIG. 4.

Referring to FIGS. 6 and 7, the display device 100" may include a cover window 110", a first adhesive layer 141", a panel member (190"), and a second adhesive layer 142". Also, the panel member 190" may include at least one of a touch screen panel (TSP) 120" and a display panel 130". Hereinafter, for convenience of descriptions, the panel member 190" including all of the TSP 120" and the display panel 130" will be described in details.

The cover window 110", the first adhesive layer 141", the TSP 120", the second adhesive layer 142", and the display panel 130" are similar to the cover window 110, the first adhesive layer 141, the TSP 120, the second adhesive layer 142, and the display panel 130 which are described with reference to FIGS. 1 to 3, respectively.

Here, the cover window 110" has at least one curved portion. In an exemplary implementation, the cover window 110" has a curved surface having at least one curvature radius. Specifically, the cover window 110" has a first curved surface with a curvature radius R1, a second curved surface with a curvature radius R2, and a third curved surface with a curvature radius R3 in a length or width direction thereof. Here, the cover window 110" has curved surfaces with curvature radii R4, R5, . . . , RN (where N is natural number) in addition to the curved surfaces having the curvature radii R1, R2, and R3. However, for convenience of descriptions, the cover window 110" having the first, second, and third curved surfaces with the curvature radii R1, R2, and R3 in the width direction thereof will be described in detail below.

The laminating device 300 includes a first jig 310, a second jig 320, a cushion unit 330, auxiliary film fixing units 340a and 240b, a fixing unit 350, and a driving unit 360. Here, the first jig 310, the second jig 320, the cushion unit 330, the auxiliary film fixing units 340a and 340b, the fixing unit 350, and the driving unit 360 are similar to those according to the foregoing embodiment.

At least one portion of an outer surface of the first jig 310 has the same shape as an outer surface of the cover window 110". Specifically, at least one portion of an outer surface of the first jig 310 has a curved surface with at least one curvature radius similar to that of an outer surface of the cover window 110". Here, the curved surface formed on the outer surface of the first jig 310 is recessed toward an upper side when viewed in FIG. 6.

An outer surface of the second jig 320 is matched in shape with the outer surface of the first jig 310. In an exemplary implementation, the outer surface of the second jig 320 protrudes to match the recessed outer surface of the first jig 310. Here, the outer surface of the second jig 320 has at least one curvature radius.

The fixing unit 350 may have various structures as described above. In an exemplary implementation, the fixing unit 350 includes an adhesive chuck or an electrostatic chuck. In another exemplary implementation, the fixing unit 350 is included as an adhesive material. Also, the fixing unit 350 includes a suction unit (not marked) formed within the first jig 310 and a suction pump (not marked) suctioning air within the suction unit. A portion of the suction unit is exposed to the outside of the first jig 310. In another exemplary implementation, the fixing unit 350 includes a separate frame, clamp, or holder that mechanically fixes the cover window 110". Hereinafter, for convenience of descriptions, the fixing unit 350 including the suction unit and the suction pump will be described in detail below.

The auxiliary film fixing units 340a and 340b and the driving unit 360 except for the first jig 310, the second jig 320, and the fixing unit 350 are equal or similar to those according to the foregoing embodiment, and thus, their detailed descriptions will be omitted. Hereinafter, an operation of the laminating device 300 will be described in details.

When the display device 100" is manufactured by using the laminating device 300, processes similar to those according to the foregoing embodiment is performed. Particularly, as described above, the cover window 110", the TSP 120", and the display panel 130" are manufactured and prepared.

When the above-described process is finished, the cover window 110" is seated on the first jig 310. Here, since one surface of the cover window 110" has the same shape as the seating surface of the first jig 310, the one surface of the cover window 110" is closely attached to the seating surface of the first jig 310.

As described above, when the cover window 110" is seated on the first jig 310, the suction pump may operate to suction air within the suction unit. Here, the suction unit exposed to the outer surface of the first jig 310 may absorb and fix the outer surface of the cover window 110".

The TSP 120" and the display panel 130" may adhere to each other by using the second adhesive layer 142", and then the first adhesive layer 141" is formed on the TSP 120" to fix the display panel 130" to an auxiliary film 370. Here, since the method of fixing the display panel 130" to the auxiliary film 370 is equal or similar to that according to the foregoing embodiment, detailed descriptions thereof will be omitted.

As described above, the TSP 120" and the display panel 130" are fixed to the auxiliary film 370, and then the auxiliary film 370 is fixed to the first and second auxiliary film fixing units 340a and 340b. Here, the first and second auxiliary film fixing units 340a and 340b may pull both ends of the auxiliary film 370 to maintain a tension of the auxiliary film 370 at a predetermined level or more. Thus, movement of the auxiliary film 370, the TSP 120", and the display panel 130" toward the second jig 320 by weights of the TSP 120" and the display panel 130" or an external force is prevented by the tension of the auxiliary film 370.

When the above-described process is finished, the driving unit 360 may operate to move at least one of the first and second jigs 310 and 320. Also, the first and second auxiliary film fixing units 340a and 340b may linearly move according to the operation of the driving unit 360. However, for convenience of descriptions, the structure in which the driving unit 360 moves the first jig 310 to the second jig 320 will be described in detail below. Also, the structure in which the first and second auxiliary film fixing units 340a and 340b are fixed to fix the auxiliary film 370 will be described in detail below.

As described above, when the driving unit 360 operates, the first jig 310 may move to the second jig 320, and then at least one portion of the cover window 110" absorbed to he first jig 310 may contact the first adhesive layer 141".

Here, since a central portion of the second jig 320 protrudes to have a curved shape, the first adhesive layer 141" and the cover window 110" are successively attached from a central portion to both ends of the cover window 110".

Also, while the above-described process is performed, the cushion unit 330 may disperse a force applied to the cover window 110", the TSP 120" and the display panel 130".

Particularly, the cushion unit 330 may remove bubbles generated between the first adhesive layer 141" and the outer surface of the cover window 110" in addition to the dispersion of the force as described above.

Thus, the laminating device 300 may successively attach the cover window 110" and the panel member 190" to each other to maximally prevent the generation of the bubbles. Also, the laminating device 300 may manufacture the display device 100" in various shapes.

Particularly, when the display device 100" is manufactured by using the laminating device 300, the panel member 190" is fixed by using the auxiliary film 370 to minimize damage of the panel member 190" due to the external force.

Figure 8:
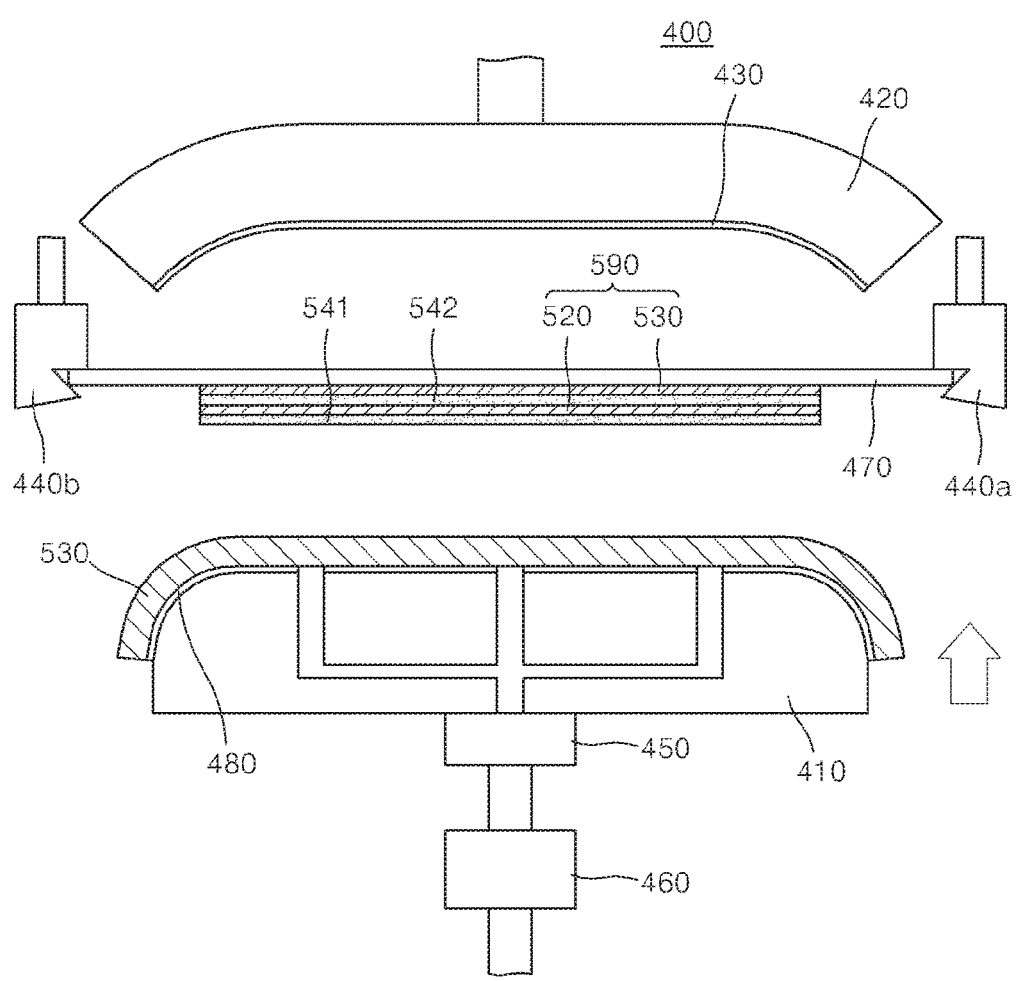
FIG. 8 is a cross-sectional view of a laminating device according to further another embodiment of the disclosed technology.
Figure 9:
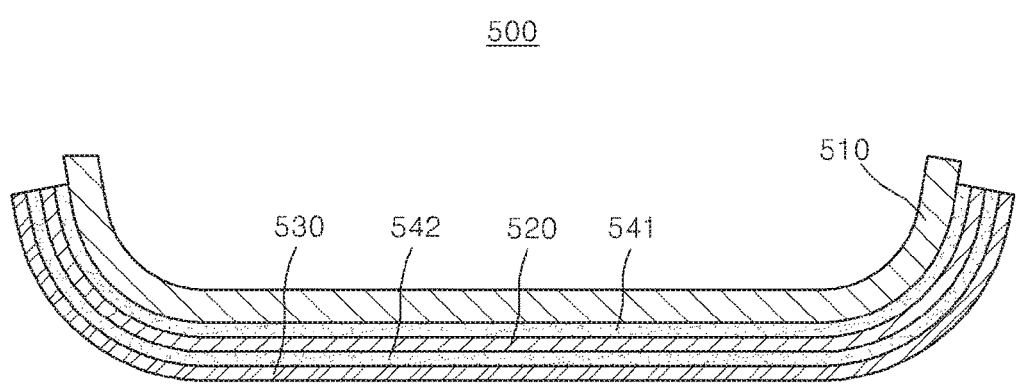
FIG. 9 is a cross-sectional view of a display device manufactured by using the laminating device shown in FIG. 8.

FIG. 8 is a cross-sectional view of a laminating device 400 according to further another embodiment of the disclosed technology. FIG. 9 is a cross-sectional view of a display device 500 manufactured by using the laminating device 400 shown in FIG. 8.

Referring to FIGS. 8 and 9, the display device 500 may include a cover window 510, a first adhesive layer 541, a panel member (590), and a second adhesive layer 542. Here, the panel member 590 may include at least one of a touch screen panel (TSP) 520 and a display panel 530. Hereinafter, for convenience of descriptions, the panel member 590 including all of the TSP 520 and the display panel 530 will be described in details. The cover window 510, the first adhesive layer 541, the TSP 520, the second adhesive layer 542, and the display panel 530 are similar to the cover window 110, the first adhesive layer 141, the TSP 120, the second adhesive layer 142, and the display panel 130 which are described with reference to FIGS. 1 to 3, respectively.

The cover window 510 may have both curved ends. Particularly, the cover window 510 may have a flat central portion. Here, both ends of the flat central portion are curved. Also, unlike the structure described with reference to FIGS. 1 to 3, the TSP 520 and the display panel 530 are formed on a protruding portion of the cover window 510, but not be formed on a recessed portion of the cover window 510.

The laminating device 400 may include a first jig 410, a second jig 420, a cushion unit 430 and 480, auxiliary film fixing units 440a and 440b, a fixing unit 450, and a driving unit 460. Here, the first jig 410 may have a shape similar to that of the cover window 510. Particularly, a seating surface of the first jig 410 on which the cover window 510 is seated may have a shape equal or similar to that of the recessed outer surface of the cover window 510. Here, the second jig 420 is formed above the first jig 410 when viewed in FIG. 8 to face the first jig 410. Here, at least one portion of the second jig 410 is matched in shape with the seating surface of the first jig 410. Particularly, the at least one portion of the second jig 410 is recessed toward an upper side when viewed in FIG. 8.

The cushion units 430 and 480 may include a first cushion unit 480 formed on an outer surface of the first jig 410 and a second cushion unit 430 formed on an outer surface of the second jig 420. Here, since each of the first and second cushion units 480 and 430 are equal or similar to the cushion unit 3 described with reference to FIGS. 1 to 3, detailed descriptions thereof will be omitted.

Also, the auxiliary film fixing units 440a and 440b may include a first auxiliary film fixing unit 440a and a second auxiliary film fixing unit 440b. Here, the first and second auxiliary film fixing units 440a and 440b are similar to those according to the foregoing embodiment. Particularly, the first and second auxiliary film fixing units 440a and 440b are formed to face each other on side surfaces of the second jig 420. However, the first and second auxiliary film fixing units 440a and 440b may linearly move according to movement of the driving unit 460. Here, the first and second auxiliary film fixing units 440a and 440b may linearly move in the same direction as that of the first jig 410. Alternatively, the first and second auxiliary film fixing units 440a and 440b are angled at a predetermined angle with respect to the linear movement direction of the first jig 410. However, for convenience of descriptions, the structure in which the first and second auxiliary film fixing units 440a and 440b do not linearly move will be described in detail below.

Here, since the fixing unit 450 and the driving unit 460 are equal or similar to those described with reference to FIGS. 6 and 7, their detailed descriptions will be omitted.

Particularly, in an operation of the laminating device 400, as described above, the cover window 510, the TSP 520, and the display panel 530 are manufactured and prepared. Here, the TSP 520 and the display panel 530 may adhere to each other by using the second adhesive layer 542 and thus be fixed. Also, the TSP 520 and the display panel 530 are fixed to an auxiliary film 470. Here, since the method of fixing the TSP 520 and the display panel 530 is equal or similar to that according to the foregoing embodiment, detailed descriptions thereof will be omitted.

When the above-described process is finished, the cover window 510 is seated on the first jig 410. Here, the cover window 510 is closely attached to an outer surface of the second cushion unit 480. Also, when the cover window 510 is seated, a suction pump (not marked) may operate to fix the cover window 510 through a suction unit (not marked).

As described above, when the cover window 510 is seated, the auxiliary film 470 is fixed to the first and second auxiliary fixing units 440a and 440b. Here, the auxiliary film 470 is maintained at a predetermined tension by the first and second auxiliary fixing units 440a and 440b as described above.

When the above-described process is finished, the first and second jigs 410 and 420 are aligned with each other. Here, an align key (not shown) is formed on at least one of the first and second jigs 410 and 420. Also, an align key identification unit (not shown) identifying the align key is formed on the other one of the first and second jigs 410 and 420. The align key identification unit may identify a position of the align key to determine whether the first and second jigs 410 and 420 are aligned with each other. In the measured result, if the first and second jigs 410 and 420 are misaligned with each other, the first and second jigs 410 and 420 are aligned again in position. Here, the method of aligning the first and second jigs 410 and 420 is not limited to the above-described method. In an exemplary implementation, all devices and methods which are capable of measuring the positions of the first and second jigs 410 and 420 to align the first and second jigs 410 and 420 with each other are applied to the disclosed technology.

When the above-described process is finished, the driving unit 360 may operate to press the first and second jigs 410 and 420. Here, the first jig 410 may linearly move so that the first and second jigs 410 and 420 are adjacent to each other.

As described above, when the first jig 410 moves, the first adhesive layer 541 may contact the cover window 510 to fix the cover window 510, the TSP 520, and the display panel 530. Here, the TSP 520 and the display panel 530 are bent and attached to the protruding outer surface of the cover window 510. Particularly, each of the TSP 520 and the display panel 530 is flexible. Thus, the TSP 520 and the display panel 530 are bent along the outer surface of the cover window 510 from the flat state and then be attached to the outer surface of the cover window 510.

When the above-described process is finished, the driving unit 460 may operate to separate the first jig 410 from the second jig 420. Here, when the first and second jigs 410 and 420 are spaced apart from each other, the display device 500 may move as described with reference to FIGS. 1 to 3.

When the above-described process is finished, the display device 500 is withdrawn. Here, the laminating device 400 may include a chamber (not shown) and a pressure adjustment unit (not shown) connected to the chamber to maintain a vacuum state within the chamber. Particularly, the inside of the chamber is maintained in the vacuum state when the above-described process is performed. On the other hand, when the display device 500 is withdrawn, the inside of the chamber is maintained in an atmospheric state.

Thus, the laminating device 400 may successively attach the cover window 510 and the panel member 590 to each other to maximally prevent the generation of the bubbles. Also, the laminating device 400 may manufacture the display device 500 in various shapes.

Particularly, when the display device 500 is manufactured by using the laminating device 400, the panel member 590 is fixed by using the auxiliary film 470 without directly applying a force to a panel member 590 to minimize damage of the panel member 590 due to the external force.

Figure 10:
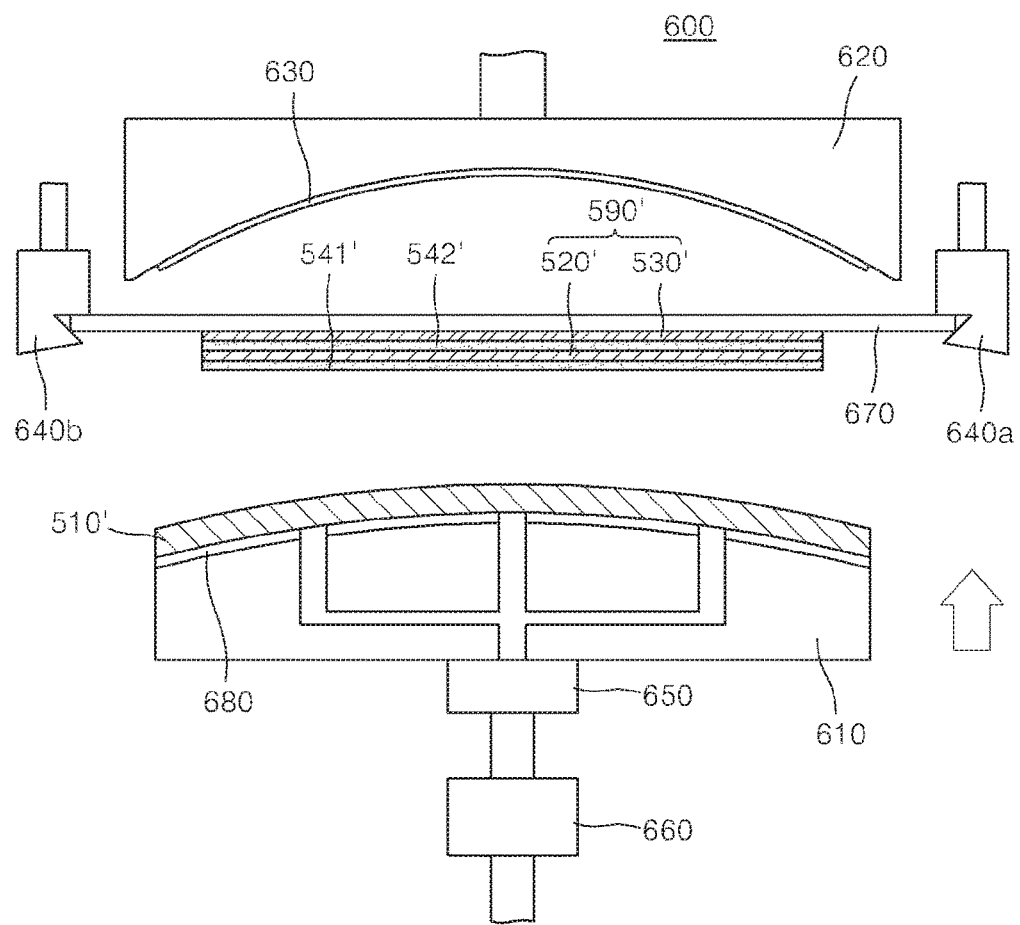
FIG. 10 is a cross-sectional view of a laminating device according to further another embodiment of the disclosed technology.
Figure 11:
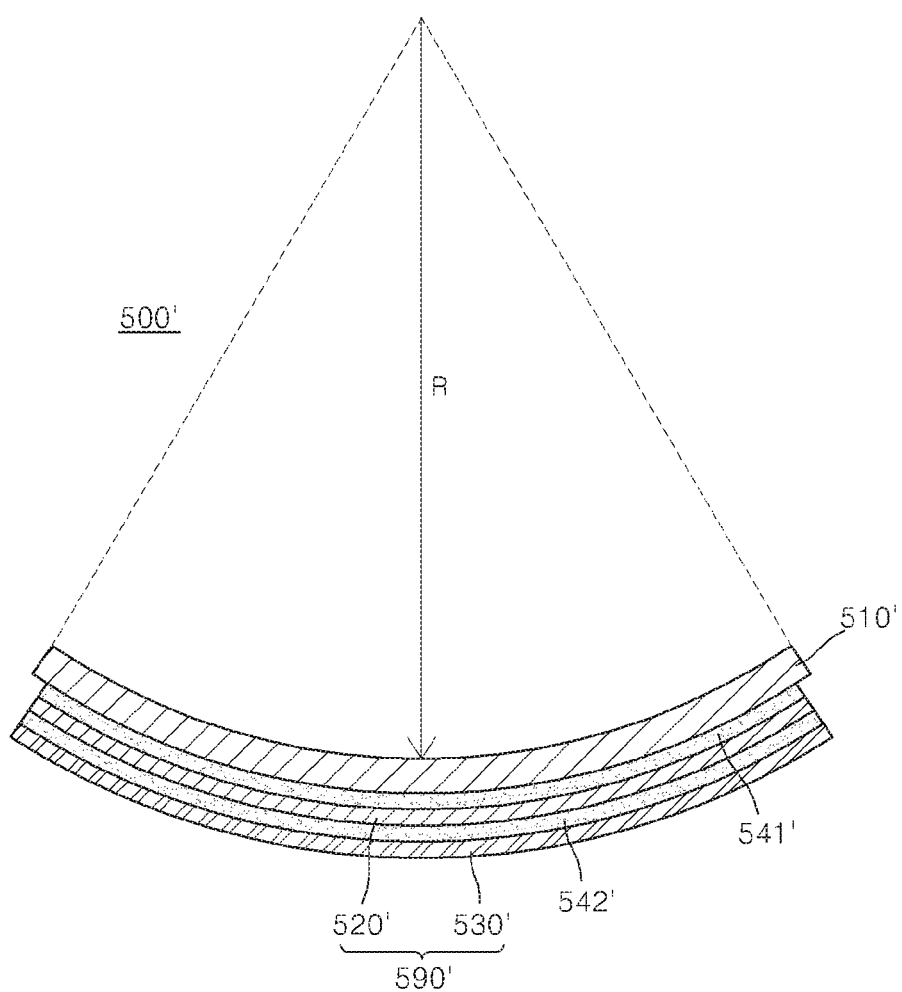
FIG. 11 is a cross-sectional view of a display device manufactured by using the laminating device shown in FIG. 10.

FIG. 10 is a cross-sectional view of a laminating device 600 according to further another embodiment of the disclosed technology. FIG. 11 is a cross-sectional view of a display device 500' manufactured by using the laminating device 600 shown in FIG. 10.

Referring to FIGS. 10 and 11, the display device 500' may include a cover window 510', a first adhesive layer 541', a panel member (590'), and a second adhesive layer 542'. Also, the panel member 590' may include at least one of a touch screen panel (TSP) 520' and a display panel 530'. Hereinafter, for convenience of descriptions, the panel member 590' including all of the TSP 520' and the display panel 530' will be described in details.

The cover window 510', the first adhesive layer 541', the TSP 520', the second adhesive layer 542', and the display panel 530' are similar to the cover window 510, the first adhesive layer 541, the TSP 520, the second adhesive layer 542, and the display panel 530 which are described with reference to FIGS. 8 and 9, respectively.

Here, the cover window 510' may have at least one curved portion. Particularly, the cover window 510' may have a curved surface having a predetermined radius curvature. Specifically, the cover window 510' may have a curved surface with a radius curvature R in a length or width direction thereof. Hereinafter, for convenience of descriptions, the cover window 510' having the curved surface with the radius curvature R in the length direction thereof will be described in detail below.

The laminating device 600 may include a first jig 610, a second jig 620, cushion units 630 and 680, auxiliary film fixing units 640a and 640b, a fixing unit 650, and a driving unit 660. Here, the first jig 610, the second jig 620, the cushion units 630 and 680, the auxiliary film fixing units 640a and 640b, the fixing unit 650, and the driving unit 660 are similar to those described with respect to FIGS. 8 and 9.

At least one portion of an outer surface of the first jig 610 may have the same shape as an outer surface of the cover window 510'. Specifically, at least one portion of an outer surface of the first jig 610 may have a curved surface with a predetermined radius curvature similar to that of an outer surface of the cover window 510'. Here, the curved surface formed on the outer surface of the first jig 610 may protrude toward an upper side when viewed in FIG. 10.

An outer surface of the second jig 620 is matched in shape with the outer surface of the first jig 610. Particularly, the outer surface of the second jig 620 is recessed to match the protruding outer surface of the first jig 610. Here, the outer surface of the second jig 620 may have a predetermined radius curvature.

The fixing unit 650 may have various structures as described above. In an exemplary implementation, the fixing unit 650 includes an adhesive chuck or an electrostatic chuck. Alternatively, the fixing unit 350 is included as an adhesive material. Also, the fixing unit 650 may include a suction unit (not marked) formed within the first jig 610 and of which a portion is exposed to the outside of the first jig 610 and a suction pump (not marked) suctioning air within the suction unit. Particularly, the fixing unit 650 may include a separate frame, clamp, or holder that mechanically fixes the cover window 510'. Hereinafter, for convenience of descriptions, the fixing unit 650 including the suction unit and the suction pump will be described in details.

The auxiliary film fixing units 640a and 640b and the driving unit 660 except for the first jig 610, the second jig 620, and the fixing unit 650 are equal or similar to those described above, and thus, their detailed descriptions will be omitted. Hereinafter, an operation of the laminating device 600 will be described in detail below.

When the display device 500' is manufactured by using the laminating device 600, processes similar to those described above are performed. Particularly, as described above, the cover window 510', the TSP 520', and the display panel 530' are manufactured and prepared.

When the above-described process is finished, the cover window 510' is seated on the first jig 610. Here, since one surface of the cover window 510' has the same shape as the seating surface of the first jig 610 on which the cover window 510' is seated, the one surface of the cover window 510' is closely attached to the first cushion unit 680.

As described above, when the cover window 510' is seated on the first cushion 680, the suction pump may operate to suction air within the suction unit. Here, the suction unit exposed to the outer surface of the first cushion 680 may absorb and fix the outer surface of the cover window 510'.

The TSP 520' and the display panel 530' may adhere to each other by using the second adhesive layer 542', and then the first adhesive layer 541' is formed on the TSP 520' to fix the display panel 530' to an auxiliary film 670. Here, since the method of fixing the display panel 530' to the auxiliary film 670 is equal or similar to that described above, detailed descriptions thereof will be omitted.

As described above, the TSP 520' and the display panel 530' are fixed to the auxiliary film 670, and then the auxiliary film 670 is fixed to the first and second auxiliary film fixing units 640a and 640b. Here, the first and second auxiliary film fixing units 640a and 640b may pull both ends of the auxiliary film 670 to maintain a tension of the auxiliary film 670 at a predetermined level or more. Thus, movement of the auxiliary film 670, the TSP 520', and the display panel 530' toward the second jig 620 by weights of the TSP 520' and the display panel 530' or an external force are prevented by the tension of the auxiliary film 670.

When the above-described process is finished, the driving unit 660 may operate to move at least one of the first and second jigs 610 and 620. Also, the first and second auxiliary film fixing units 640a and 640b may linearly move according to the operation of the driving unit 660. However, for convenience of descriptions, the structure in which the driving unit 660 moves the first jig 610 to the second jig 620 will be described in detail below. Also, the structure in which the first and second auxiliary film fixing units 640a and 640b are fixed to fix the auxiliary film 670 will be described in detail below.

As described above, when the driving unit 660 operates, the first jig 610 may move to the second jig 620, and then at least one portion of the cover window 510' absorbed to he first jig 610 may contact the first adhesive layer 541'.

Here, since a central portion of the cover window 510' protrudes to have a curved shape, the first adhesive layer 5411 and the cover window 5101 are successively attached from the central portion to both ends of the cover window 510'.

Also, while the above-described process is performed, the first and second cushion units 680 and 630 may disperse a force applied to the cover window 510', the TSP 520' and the display panel 530'. Particularly, the first and second cushion units 680 and 630 may remove bubbles generated between the first adhesive layer 541' and the outer surface of the cover window 510' in addition to the dispersion of the force as described above.

Thus, the laminating device 600 may successively attach the cover window 510' and the panel member 590' to each other to maximally prevent the generation of the bubbles. Also, the laminating device 600 may manufacture the display device 500' in various shapes.

Particularly, when the display device 500' is manufactured by using the laminating device 600, the panel member 590' is fixed by using the auxiliary film 670 without directly applying a force to a panel member 590' to minimize damage of the panel member 590' due to the external force.

Figure 12:
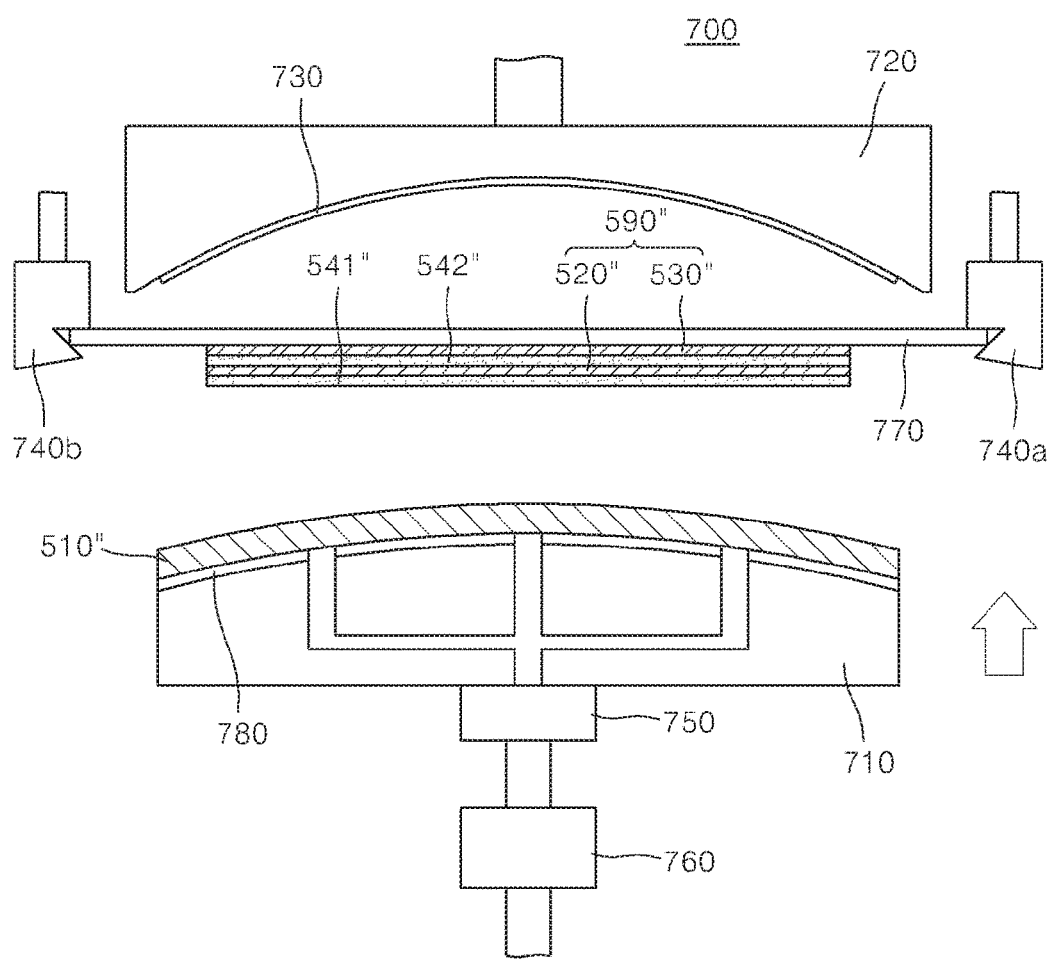
FIG. 12 is a cross-sectional view of a laminating device according to further another embodiment of the disclosed technology.
Figure 13:
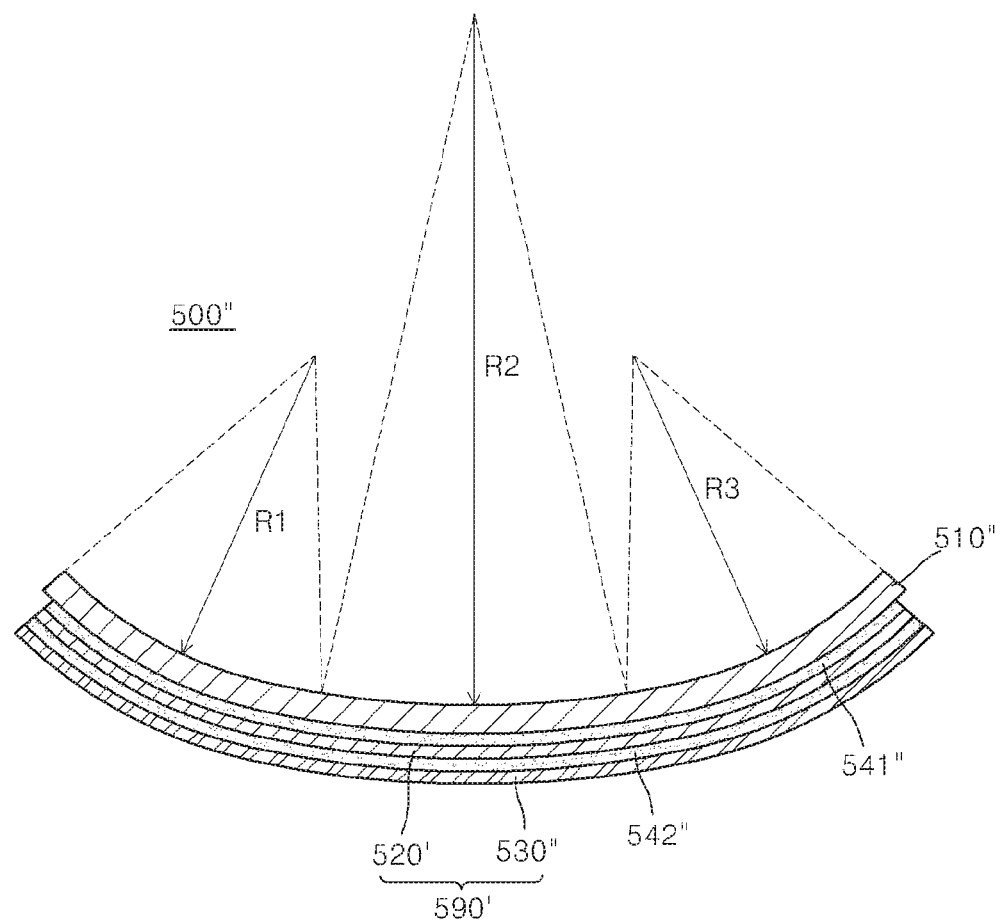
FIG. 13 is a cross-sectional view of a display device manufactured by using the laminating device shown in FIG. 12.

FIG. 12 is a cross-sectional view of a laminating device 700 according to further another embodiment of the disclosed technology. FIG. 13 is a cross-sectional view of a display device 500" manufactured by using the laminating device 700 shown in FIG. 12.

Referring to FIGS. 12 and 13, the display device 500" may include a cover window 510", a first adhesive layer 541", a panel member (590"), and a second adhesive layer 542". Also, the panel member 590" may include at least one of a touch screen panel (TSP) 520" and a display panel 530". Hereinafter, for convenience of descriptions, the panel member 590" including all of the TSP 520" and the display panel 530" will be described in detail below.

The cover window 510", the first adhesive layer 541", the TSP 520", the second adhesive layer 542", and the display panel 530" are similar to the cover window 510, the first adhesive layer 541, the TSP 520, the second adhesive layer 542, and the display panel 530 which are described with reference to FIGS. 8 and 9, respectively.

Here, the cover window 510" may have at least one curved portion. Particularly, the cover window 510" may have a curved surface having at least one radius curvature. Specifically, the cover window 510" may have a first curved surface with a radius curvature R1, a second curved surface with a radius curvature R2, and a third curved surface with a radius curvature R3 in a length or width direction thereof. Here, the cover window 510" may have curved surfaces with curvature radii R4, R5, . . . , RN (where N is natural number) in addition to the curved surfaces having the curvature radii R1, R2, and R3. However, for convenience of descriptions, the cover window 510" having the first, second, and third curved surfaces with the curvature radii R1, R2, and R3 in the width direction thereof will be described in detail below.

The laminating device 700 may include a first jig 710, a second jig 720, cushion units 730 and 780, auxiliary film fixing units 740a and 740b, a fixing unit 750, and a driving unit 760. Here, the first jig 710, the second jig 720, the cushion units 730 and 780, the auxiliary film fixing units 740a and 740b, the fixing unit 750, and the driving unit 760 are similar to those described with respect to FIGS. 8 and 9.

At least one portion of an outer surface of the first jig 710 may have the same shape as an outer surface of the cover window 510". Specifically, at least one portion of an outer surface of the first jig 710 has a curved surface with at least one curvature radius similar to that of an outer surface of the cover window 510". Here, the curved surface formed on the outer surface of the first jig 710 may protrude toward an upper side when viewed in FIG. 12.

An outer surface of the second jig 720 is matched in shape with the outer surface of the first jig 710. Particularly, the outer surface of the second jig 720 is recessed to match the recessed outer surface of the first jig 710. Here, the outer surface of the second jig 720 may have at least one curvature radius.

The fixing unit 750 may have various structures as described above. In an exemplary implementation, the fixing unit 750 includes an adhesive chuck or an electrostatic chuck. Alternatively, the fixing unit 350 is included as an adhesive material. Also, the fixing unit 750 may include a suction unit (not marked) formed within the first jig 710 and of which a portion is exposed to the outside of the first jig 710 and a suction pump (not marked) suctioning air within the suction unit. Particularly, the fixing unit 750 may include a separate frame, clamp, or holder that mechanically fixes the cover window 510". Hereinafter, for convenience of descriptions, the fixing unit 750 including the suction unit and the suction pump will be described in detail below.

The auxiliary film fixing units 740a and 740b and the driving unit 760 except for the first jig 710, the second jig 720, and the fixing unit 750 are equal or similar to those described above, and thus, their detailed descriptions will be omitted. Hereinafter, an operation of the laminating device 700 will be described in detail below.

When the display device 500" is manufactured by using the laminating device 700, processes similar to those described above is performed. Particularly, as described above, the cover window 510", the TSP 520", and the display panel 530" are manufactured and prepared.

When the above-described process is finished, the cover window 510" is seated on the first jig 710. Here, since one surface of the cover window 510" has the same shape as the seating surface of the first jig 710 on which the cover window 510" is seated, the one surface of the cover window 510" is closely attached to the first cushion unit 780.

As described above, when the cover window 510" is seated on the first cushion 780, the suction pump may operate to suction air within the suction unit. Here, the suction unit exposed to the outer surface of the first cushion 780 may absorb and fix the outer surface of the cover window 510".

The TSP 520" and the display panel 530" may adhere to each other by using the second adhesive layer 542", and then the first adhesive layer 541" is formed on the TSP 520" to fix the display panel 530" to an auxiliary film 770. Here, since the method of fixing the display panel 530" to the auxiliary film 770 is equal or similar to that described above, detailed descriptions thereof will be omitted.

As described above, the TSP 520" and the display panel 530" are fixed to the auxiliary film 770, and then the auxiliary film 770 is fixed to the first and second auxiliary film fixing units 740*a* and 740*b*. Here, the first and second auxiliary film fixing units 740*a* and 740*b* may pull both ends of the auxiliary film 770 to maintain a tension of the auxiliary film 770 at a predetermined level or more. Thus, movement of the auxiliary film 770, the TSP 520", and the display panel 530" toward the second jig 720 by weights of the TSP 520" and the display panel 530" or an external force is prevented by the tension of the auxiliary film 770.

When the above-described process is finished, the driving unit 760 may operate to move at least one of the first and second jigs 710 and 720. Also, the first and second auxiliary film fixing units 740*a* and 740*b* may linearly move according to the operation of the driving unit 760. However, for convenience of descriptions, the structure in which the driving unit 760 moves the first jig 710 to the second jig 720 will be described in detail below. Also, the structure in which the first and second auxiliary film fixing units 740*a* and 740*b* are fixed to fix the auxiliary film 770 will be described in details.

As described above, when the driving unit 760 operates, the first jig 710 may move to the second jig 720, and then at least one portion of the cover window 510" absorbed to he first jig 710 may contact the first adhesive layer 541".

Here, since a central portion of the second jig 720 protrudes to have a curved shape, the first adhesive layer 541" and the cover window 510" are successively attached from a central portion to both ends of the cover window 510".

Also, while the above-described process is performed, the first and second cushion unit 780 and 730 may disperse a force applied to the cover window 510', the TSP 520' and the display panel 530'. Particularly, the first and second cushion units 780 and 730 may remove bubbles generated between the first adhesive layer 541" and the outer surface of the cover window 510" in addition to the dispersion of the force as described above.

Thus, the laminating device 700 may successively attach the cover window 510" and the panel member 590" to each other to maximally prevent the generation of the bubbles. Also, the laminating device 700 may manufacture the display device 500" in various shapes.

Particularly, when the display device 500" is manufactured by using the laminating device 700, the panel member 590" are fixed by using the auxiliary film 770 without directly applying a force to a panel member 590" to minimize damage of the panel member 590" due to the external force.

According to the embodiments of the disclosed technology, the cover window and the panel member 590" of which portions respectively have the curved shapes is quickly accurately attached to each other to improve productivity and quality reliability. Also, according to the embodiments of the disclosed technology, since the display device is quickly manufactured, the working time and the manufacturing costs is reduced.

For purposes of summarizing the disclosed technology, certain aspects, advantages and novel features of the disclosed technology have been described herein. It is to be understood that not necessarily all such advantages is achieved in accordance with any particular embodiment of the disclosed technology. Thus, the disclosed technology is embodied or carried out in a manner that achieves or optimizes one advantage or group of advantages as taught herein without necessarily achieving other advantages as is taught or suggested herein.

Various modifications of the above described embodiments will be readily apparent, and the generic principles defined herein is applied to other embodiments without departing from the spirit or scope of the disclosed technology. Thus, the disclosed technology is not intended to be limited to the embodiments shown herein but is to be accorded the widest scope consistent with the principles and novel features disclosed herein.

While the disclosed technology has been particularly shown and described with reference to exemplary embodiments thereof, it will be understood by those of ordinary skill in the art that various changes in form and details is made therein without departing from the spirit and scope of the disclosed technology as defined by the following claims.

What is claimed is:

1. A laminating device comprising:
  a first jig on which a cover window is seated, the cover window including at least one curved portion;
  a second jig on which an auxiliary film is placed flat, the second jig facing the first jig;
  an auxiliary film fixing unit configured to fix at least one portion of the auxiliary film on which a panel member is seated; and
  a driving unit configured to linearly move at least one of the first jig and the second jig,
  wherein the panel member is on the auxiliary film so as to be separated from the auxiliary film.

2. The laminating device of claim 1, wherein one of an outer surface of the first jig and an outer surface of the second jig protrudes, and
  wherein the other one of the outer surface of the first jig and the outer surface of the second jig is recessed.

3. The laminating device of claim 1, wherein an outer surface of the first jig has at least one curved surface.

4. The laminating device of claim 1, wherein a central portion of at least one of an outer surface of the first jig and an outer surface of the second jig protrudes more than the other portion of the at least one outer surface.

5. The laminating device of claim 1, wherein an outer surface of the second jig has at least one curved surface, and wherein the outer surface contacts the auxiliary film.

6. The laminating device of claim 1, wherein the auxiliary film fixing unit comprises:
  a first auxiliary film fixing unit restraining one end of the auxiliary film; and
  a second auxiliary film fixing unit restraining the other end of the auxiliary film.

7. The laminating device of claim 1, further comprising a cushion unit disposed on at least one of an outer surface of the first jig and an outer surface of the second jig.

8. The laminating device of claim 1, further comprising a fixing unit disposed on the first jig and configured to fix the cover window.

9. The laminating device of claim 1, wherein the panel member comprises at least one of a touch screen panel and a display panel.

10. A laminating device comprising:
  a first jig on which a cover window is seated, the cover window including at least one curved portion;
  a second jig on which an auxiliary film is placed flat, the second jig facing the first jig;
  an auxiliary film fixing unit configured to fix at least one portion of the auxiliary film on which a panel member is seated; and
  a driving unit configured to linearly move at least one of the first jig and the second jig, wherein the auxiliary film fixing unit is linearly movable on a side of the second jig based on linear motion of the at least one of the first jig and the second jig.

\* \* \* \* \*